United States Patent
Yoon et al.

(10) Patent No.: US 11,239,416 B2
(45) Date of Patent: Feb. 1, 2022

(54) VARIABLE RESISTANCE MEMORY DEVICE

(71) Applicant: Samsung Electronics Co., Ltd., Suwon-si (KR)

(72) Inventors: Jungho Yoon, Yongin-si (KR); Soichiro Mizusaki, Suwon-si (KR); Youngjin Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 13 days.

(21) Appl. No.: 16/691,818

(22) Filed: Nov. 22, 2019

(65) Prior Publication Data

US 2020/0350497 A1 Nov. 5, 2020

(30) Foreign Application Priority Data

May 3, 2019 (KR) .................. 10-2019-0052375

(51) Int. Cl.
*H01L 45/00* (2006.01)

(52) U.S. Cl.
CPC ........ *H01L 45/1253* (2013.01); *H01L 45/145* (2013.01)

(58) Field of Classification Search
CPC ............. H01L 27/2463; H01L 45/1233; H01L 27/2481
See application file for complete search history.

(56) References Cited

U.S. PATENT DOCUMENTS

| | | | |
|---|---|---|---|
| 7,812,335 B2 | 10/2010 | Scheuerlein | |
| 8,513,635 B2 | 8/2013 | Hwang et al. | |
| 8,995,166 B2 | 3/2015 | Pramanik et al. | |
| 9,059,391 B2 | 6/2015 | Hou et al. | |
| 9,672,917 B1 | 6/2017 | Costa et al. | |
| 2011/0031463 A1* | 2/2011 | Sato ...................... | H01L 45/146 257/4 |
| 2011/0103131 A1* | 5/2011 | Katayama ............... | H01L 45/12 365/148 |
| 2019/0393268 A1* | 12/2019 | Lai ...................... | H01L 45/1233 |

FOREIGN PATENT DOCUMENTS

KR    2013-0107876 A    10/2013

* cited by examiner

*Primary Examiner* — Lynne A Gurley
*Assistant Examiner* — Peter M Albrecht
(74) *Attorney, Agent, or Firm* — Harness, Dickey & Pierce, P.L.C.

(57) ABSTRACT

A variable resistance memory device includes a first conductive line extending in a first direction, a second conductive line extending in a second direction, the second direction intersecting the first direction on the first conductive line, a fixed resistance layer between the first conductive line and the second conductive line, and a variable resistance layer between the first conductive line and the second conductive line, wherein the fixed resistance layer and the variable resistance layer are electrically connected in parallel to each other between the first conductive line and the second conductive line.

23 Claims, 24 Drawing Sheets

VARIABLE RESISTANCE MEMORY DEVICE

CROSS-REFERENCE TO RELATED APPLICATION

This U.S. nonprovisional application claims priority under 35 U.S.C § 119 to Korean Patent Application No. 10-2019-0052375, filed on May 3, 2019, in the Korean Intellectual Property Office, the entire contents of which are hereby incorporated by reference herein.

BACKGROUND

1. Field

The present disclosure relates to variable resistance memory devices.

2. Description of the Related Art

Semiconductor devices may be classified into memory devices and logic devices. A memory device is a device that stores data. Generally, semiconductor memory devices may be mainly classified into volatile memory devices and non-volatile memory devices. A volatile memory device is a memory device in which stored data is destroyed when power supply is interrupted, and examples thereof include dynamic random access memory (DRAM), static random access memory (SRAM), etc. A nonvolatile memory device is a memory device in which stored data is not destroyed even when power supply is interrupted, and examples thereof include programmable ROM (PROM), erasable programmable read-only memory (EPROM), electrically erasable programmable ROM (EEPROM), flash memory, etc.

Also, recently, next-generation semiconductor memory devices such as magnetic random access memory (MRAM) and phase-change random access memory (PRAM) have been developed in accordance with trend of high performance and low power consumption of semiconductor memory devices. Materials comprising these next-generation semiconductor memory devices have characteristics such that their resistance values change according to current or voltage and remain unchanged even when the current or voltage supply is interrupted.

SUMMARY

Provided are some example embodiments of variable resistance memory devices having improved uniformity of resistance change characteristics.

Provided are some example embodiments of variable resistance memory devices having improved reliability.

According to an aspect of some example embodiments, a variable resistance memory device includes a first conductive line extending in a first direction; a second conductive line extending in a second direction, the second direction intersecting the first direction on the first conductive line; a fixed resistance layer between the first conductive line and the second conductive line; and a variable resistance layer between the first conductive line and the second conductive line, wherein the fixed resistance layer and the variable resistance layer are electrically connected in parallel to each other between the first conductive line and the second conductive line.

The fixer resistance layer may be in a region where the first conductive line and the second conductive line intersect each other, and wherein the variable resistance layer may be on one side surface of the fixed resistance layer.

The variable resistance layer may extend on one side surface of the second conductive line immediately adjacent to the side surface of the fixed resistance layer and may be electrically connected to the second conductive line.

The variable resistance layer may extend along an upper surface and the other side surface of the second conductive line.

A width of the fixed resistance layer in the first direction may be less than a width of the second conductive line in the first direction.

The fixed resistance layer may extend along the second conductive line.

The variable resistance layer may be in a region where the first conductive line and the second conductive line intersect each other, and wherein the fixed resistance layer may be on one side surface of the variable resistance layer.

The variable resistance memory device may further include a first electrode pattern between the first conductive line and the fixed resistance layer; and a second electrode pattern between the second conductive line and the fixed resistance layer.

The variable resistance layer may extend in a third direction perpendicular to the first and second directions and covers side surfaces of the first electrode pattern and the second electrode pattern.

The variable resistance layer may expose an upper surface of the second electrode pattern.

Each of the first electrode pattern and the second electrode pattern may have a rectangular column shape extending in a third direction perpendicular to the first and second directions.

Each of the first electrode pattern and the second electrode pattern may have a cylindrical shape extending in a third direction perpendicular to the first and second directions.

The variable resistance memory device may further include an intermediate electrode layer between the second conductive line and the fixed resistance layer; and a selection device layer between the second conductive line and the intermediate electrode layer, wherein the selection device layer may be configured to selectively block a current according to a voltage applied to the selection device layer.

The variable resistance layer may expose side surfaces of the selection device layer.

According to another aspect of some example embodiments, a variable resistance memory device includes first conductive lines extending in a first direction and arranged in a second direction that intersects with the first direction; second conductive lines extending in the second direction on the first conductive lines and arranged in the first direction; fixed resistance layers between the first conductive lines and the second conductive lines; and variable resistance layers electrically connected in parallel to the fixed resistance layers, wherein each of the fixed resistance layers is electrically connected to one of the first conductive lines immediately adjacent thereto and one of the second conductive lines immediately adjacent thereto, and wherein each of the variable resistance layers is electrically connected to one of the first conductive lines immediately adjacent thereto and one of the second conductive lines immediately adjacent thereto.

The fixed resistance layers may be respectively at regions where the first conductive lines and the second conductive lines intersect each other, and wherein each of the variable resistance layers may be on a side surface of the fixed resistance layer immediately adjacent thereto among the fixed resistance layers, and extends on a side surface of the second conductive line.

The variable resistance layers may be respectively at regions where the first conductive lines and the second conductive lines intersect each other, and wherein each of the fixed resistance layers may be on a side surface of the variable resistance layer immediately adjacent thereto among the variable resistance layers, and extends on a side surface of the second conductive line.

According to another aspect of some example embodiments, a variable resistance memory device includes first conductive line layers and second conductive line layers that are alternately stacked; fixed resistance layers between the first conductive line layers and the second conductive line layers; and variable resistance layers between the first conductive line layers, wherein each of the variable resistance layers extends along side surfaces of a pair of fixed resistance layers spaced apart from each other with one of the second conductive line layers therebetween among the fixed resistance layers, wherein each of the first conductive line layers may include first conductive lines extending in a first direction and arranged in a second direction that intersects with the first direction, and wherein each of the second conductive line layers may include second conductive lines extending in the second direction and arranged in the first direction.

Each of the variable resistance layers may be electrically connected to a pair of first conductive lines spaced apart from each other with each of the variable resistance layers therebetween among the first conductive lines and the second conductive line between the pair of first conductive lines among the second conductive lines.

Each of the variable resistance layers may include a first part electrically connected in parallel with one of the pair of fixed resistance layers and a second part electrically connected in parallel with the other one of the pair of fixed resistance layers.

According to an aspect of some example embodiments, a variable resistance memory device includes a first conductive line extending in a first direction; a second conductive line extending in a second direction, the second direction intersecting the first direction on the first conductive line; and a parallel resistance layer electrically connecting the first and second conductive lines, the parallel resistance layer including a fixed resistance layer and a variable resistance layer electrically connected in parallel, the variable resistance layer being one of a phase change material or a layer configured to have mobile oxygen vacancies

BRIEF DESCRIPTION OF THE DRAWINGS

These and/or other aspects of some example embodiments will become apparent and more readily appreciated from the following description of example embodiments, taken in conjunction with the accompanying drawings in which.

DETAILED DESCRIPTION

Figure 1:
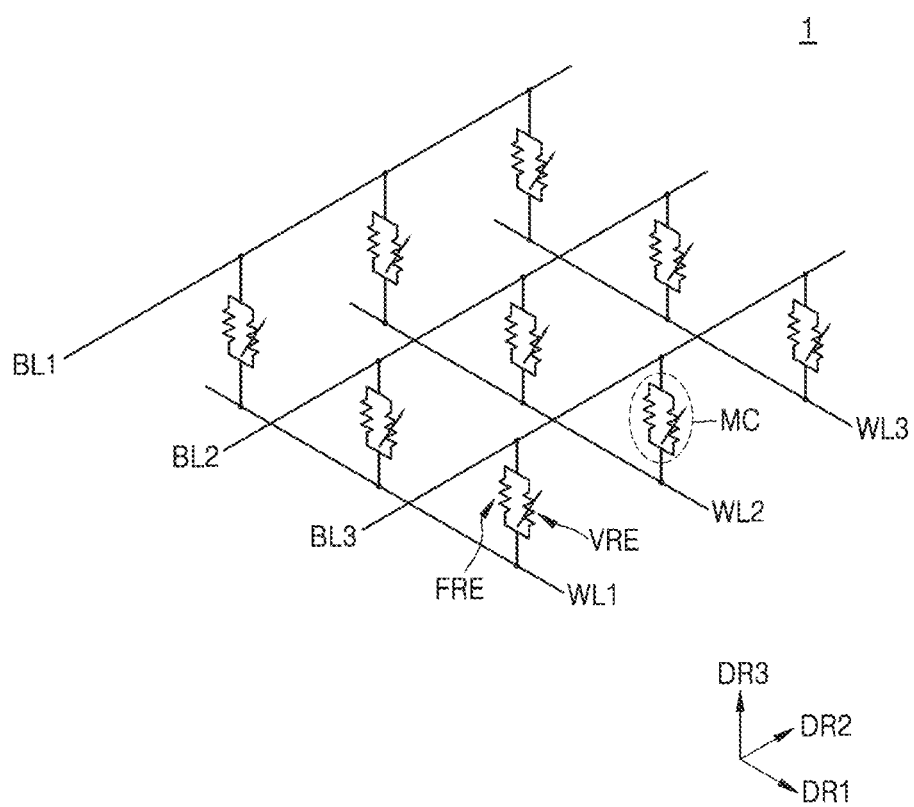
FIG. 1 is an equivalent circuit diagram of a variable resistance memory device according to some example embodiments.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will also be understood that when an element is referred to as being "on" or "above" another element, the element may be in direct contact with the other element or other intervening elements may be present.

The singular forms include the plural forms unless the context clearly indicates otherwise. Also, when a region "includes" an element, the region may further include another element instead of excluding the other element, unless otherwise differently stated.

A processor, "unit," or "circuitry" may include one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to implement the functionality.

FIG. 1 is an equivalent circuit diagram of a variable resistance memory device 1 according to some example embodiments.

Referring to FIG. 1, the variable resistance memory device 1 including word lines WL1, WL2 and WL3, bit lines BL1, BL2, BL3, and/or memory devices MC may be provided. The word lines WL1, WL2, and WL3 may extend in a first direction DR1. The word lines WL1, WL2, and WL3 may be arranged in a second direction DR2 that intersects with the first direction DR1. The bit lines BL1, BL2, and BL3 may extend in the second direction DR2. The bit lines BL1, BL2, and BL3 may be arranged in the first direction DR1.

The memory devices MC may be provided between the word lines WL1, WL2 and WL3 and the bit lines BL1, BL2 and BL3, respectively. The memory devices MC may be disposed at intersections of the word lines WL1, WL2, and WL3 and the bit lines BL1, BL2, and BL3, respectively. The memory devices MC may be electrically connected to the word lines WL1, WL2, and WL3 and the bit lines BL1, BL2, and BL3.

Each of the memory devices MC may include a variable resistance element VRE and a fixed resistance element FRE for storage of information. The variable resistance element VRE may have a resistance that varies depending on heat or voltage applied to the variable resistance element VRE. The fixed resistance element FRE may have a fixed resistance. The variable resistance element VRE and the fixed resistance element FRE may be connected in parallel such that a parallel circuit would be formed.

A voltage may be applied to the variable resistance element VRE through the word lines WL1, WL2, and WL3 and/or the bit lines BL1, BL2, and BL3. Before the voltage is applied to the variable resistance element VRE, the variable resistance element VRE may have a relatively high resistance. Accordingly, a combination resistance of the variable resistance element VRE and the fixed resistance element FRE may be relatively low. A resistance of the variable resistance element VRE may be lowered by the applied voltage. Accordingly, the combination resistance of the variable resistance element VRE and the fixed resistance element FRE may be relatively high.

The memory devices MC may store digital information such as '0' or '1' according to a change in the combined resistance of the variable resistance element VRE and the fixed resistance element FRE. For example, data may be written in a high resistance state '0' and a low resistance state '1' in the memory devices MC. Here, writing from the high resistance state '0' to the low resistance state '1' may be referred to as a 'set operation', and writing from the low resistance state '1' to the high resistance state '0' may be referred to as a 'reset operation'. However, the memory devices MC are not limited to the digital information of the high resistance state '0' and the low resistance state '1', and may store various resistance states.

Any memory device MC may be addressed by selection of the word lines WL1, WL2 and WL3 and the bit lines BL1, BL2 and BL3, and the memory devices MC may be programmed by applying a predetermined signal between the word lines WL1, WL2 and WL3 and bit lines BL1, BL2, and BL3. A current value may be measured through the bit lines BL1, BL2 and BL3, and thus, information according to a combined resistance value of the variable resistance element VRE and the fixed resistance element FRE of the memory device MC, i.e., programmed information, may be read.

Figure 2:
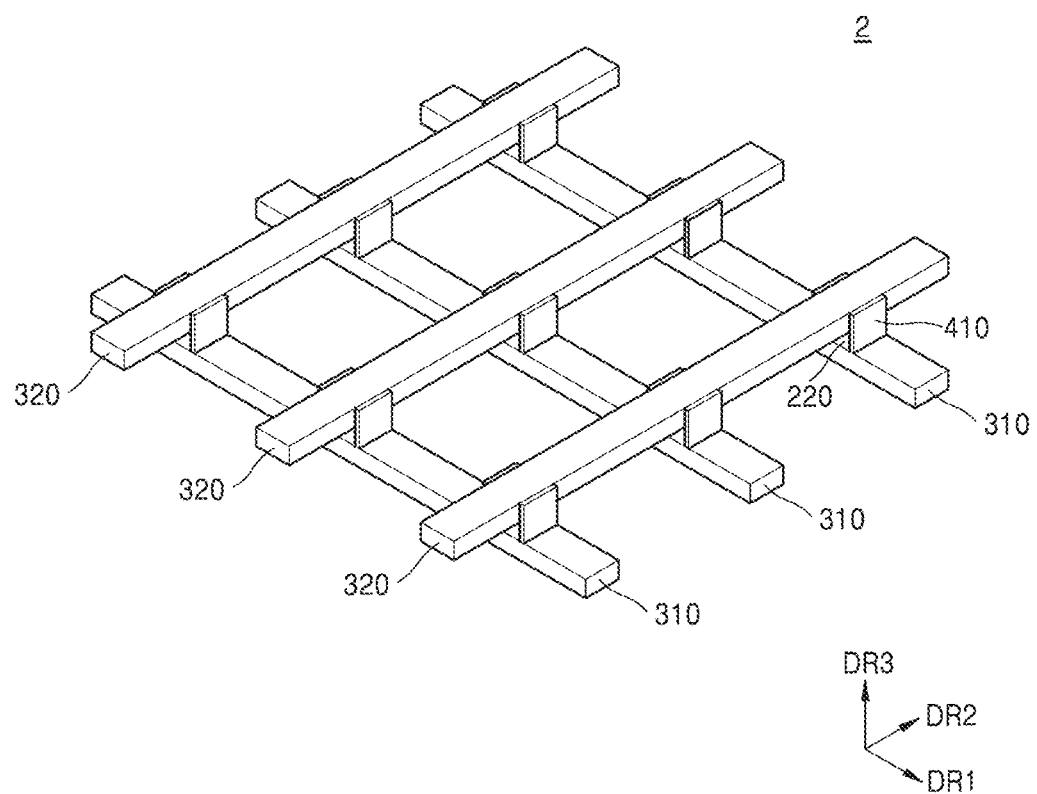
FIG. 2 is a perspective view of a variable resistance memory device according to some example embodiments.

FIG. 2 is a perspective view of a variable resistance memory device 2 according to some example embodiments. For brevity of description, substantially the same descriptions as those given with reference to FIG. 1 may be omitted.

Referring to FIG. 2, the variable resistance memory device 2 including first conductive lines 310, second conductive lines 320, fixed resistance layers 220, and variable resistance layers 410 may be provided. The first conductive lines 310 may extend in the first direction DR1. The first conductive lines 310 may be arranged in the second direction DR2. The first conductive lines 310 may include a conductive material. For example, the first conductive lines 310 may include at least one of metal (e.g., titanium (Ti), titanium nitride (TiN), tungsten (W), platinum (Pt), tantalum nitride (Al), and/or aluminum (Al)) and a doped semiconductor material (e.g., doped Si, doped IGZO, and/or doped GaAs). The first conductive lines 310 may be the bit lines (BL1, BL2, and BL3 of FIG. 1) described with reference to FIG. 1.

The second conductive lines 320 may intersect with the first conductive lines 310. The second conductive lines 320 may extend in the second direction DR2. The second conductive lines 320 may be arranged in the first direction DR1. The second conductive lines 320 may include a conductive material. For example, the second conductive lines 320 may include at least one of metal (e.g., titanium (Ti), titanium nitride (TiN), tungsten (W), platinum (Pt), tantalum nitride (Al), and/or aluminum (Al)), and a doped semiconductor material (e.g., doped Si, doped IGZO, and/or doped GaAs). The second conductive lines 320 may be the word lines (WL1, WL2, and WL3 in FIG. 1) described with reference to FIG. 1.

The fixed resistance layers 220 may be provided between the first conductive lines 310 and the second conductive lines 320. The fixed resistance layers 220 may be respectively disposed in regions where the first conductive lines 310 and the second conductive lines 320 intersect each other. Each of the fixed resistance layers 220 may extend in a third direction DR3 that intersects with the first direction DR1 and the second direction DR2. Each of the fixed resistance layers 220 may be electrically connected to the first conductive line 310 and the second conductive line 320 that are directly adjacent thereto. For example, each of the fixed resistance layers 220 may directly contact a top surface of the first conductive line 310 directly adjacent thereto and a bottom surface of the second conductive line 320 directly adjacent thereto. The fixed resistance layers 220 may have a fixed resistance. For example, the fixed resistance layers 220 may include at least one of $SiO_2$, $Al_2O_3$, and/or $HfO_2$.

The variable resistance layers 410 may be provided on side surfaces of the fixed resistance layers 220. For example, the variable resistance layers 410 may be in direct contact with the side surfaces of the fixed resistance layers 220. The variable resistance layers 410 may extend on side surfaces of the second conductive lines 320 in the third direction DR3. The variable resistance layers 410 may be electrically connected to the second conductive lines 320. For example, the variable resistance layers 410 may be in direct contact with the side surfaces of the second conductive lines 320. The variable resistance layers 410 may be electrically connected to the first conductive lines 310. For example, the variable resistance layers 410 may be in direct contact with upper surfaces of the first conductive lines 310. Each of the variable resistance layers 410 may be electrically connected in parallel with the fixed resistance layer 220 directly adjacent thereto.

The variable resistance layers 410 may have a variable resistance. The variable resistance layers 410 may store data using the variable resistance. The resistance of the variable resistance layers 410 may change by an oxygen vacancy or a phase inside the variable resistance layers 410. When the resistance of the variable resistance layers 410 changes by the oxygen vacancy, the variable resistance layers 410 may include a dielectric layer in which the oxygen vacancy may move. For example, the variable resistance layers 410 may include an oxide layer and/or a nitride layer. When the variable resistance layers 410 include the oxide layer, the variable resistance layers 410 may include at least one of, for example, $HfO_2$, $Al_2O_3$, $Ta_2O_5$, $TiO_2$, and/or $ZrO_2$. When the variable resistance layers 410 include the nitride layer, the variable resistance layers 410 may include, for example, SiN. In some example embodiments, the resistance of the variable resistance layers 410 may vary according to the density of the oxygen vacancy inside the variable resistance layers 410. When the density of the oxygen vacancy is high in the variable resistance layers 410, the variable resistance layers 410 may have a low resistance state. When the density of the oxygen vacancy is low in the variable resistance layers 410, the variable resistance layers 410 may have a high resistance state. In some example embodiments, the resistance of the variable resistance layers 410 may vary depending on whether electrons are stuck in a trap of the variable resistance layers 410. The traps may be formed by the oxygen vacancy. When electrons are stuck in the trap of the variable resistance layers 410, the variable resistance layers 410 may have the low resistance state. When electrons are not stuck in the trap of the variable resistance layers 410, the variable resistance layers 410 may have the high resistance state.

In some example embodiments, the variable resistance layers 410 may include a phase change material. For example, the variable resistance layers 410 may include GST ($Ge_2Sb_2Te_5$). When the variable resistance layers 410 have a crystalline state, the variable resistance layers 410 may have the low resistance state. When the variable resistance layers 410 have an amorphous state, the variable resistance layers 410 may have the high resistance state.

In some example embodiments, the variable resistance layer 410 and the fixed resistance layer 220 may be replaced with each other. In other words, a configuration shown in FIG. 2 as the fixed resistance layer 220 may include a material having a variable resistance characteristic, and a configuration shown as the variable resistance layer 410 may include a material having a fixed resistance characteristic.

In the case of not including a fixed resistance layer electrically connected in parallel with a variable resistance layer between the first conductive line 310 and the second conductive line 320, the resistance between the first conductive line 310 and the second conductive line 320 (the resistance of the memory device MC in FIG. 1) may be the resistance of the variable resistance layer 410. As the integration of the variable resistance memory device increases, the size of the variable resistance layer 410 may be reduced. As the size of the variable resistance layer 410 is reduced, the resistance of the variable resistance layer 410 may vary unevenly. The resistance value (the resistance value of the memory device MC in FIG. 1) between the first conductive line 310 and the second conductive line 320 may vary unevenly. As a result, the reliability of the variable resistance memory device may be lowered.

Some example embodiments may include the fixed resistance layer 220 and the variable resistance layer 410 electrically connected in parallel between the first conductive line 310 and the second conductive line 320. The resistance (the resistance of the memory device MC in FIG. 1) between the first conductive line 310 and the second conductive line 320 may be a combination resistance of the fixed resistance layer 220 and the variable resistance layer 410. The combination resistance may change as the resistance of the variable resistance layer 410 changes. When the resistance of the variable resistance layer 410 unevenly changes, a degree of unevenness of the change in the combination resistance may be smaller than a degree of unevenness of a resistance change in the variable resistance layer 410. That is, a degree of unevenness in the resistance change (a resistance change of the memory device MC in FIG. 1) between the first conductive line 310 and the second conductive line 320 may be reduced by the fixed resistance layer 220. Accordingly, the variable resistance memory device 2, which is highly reliable, may be provided.

Figure 3:
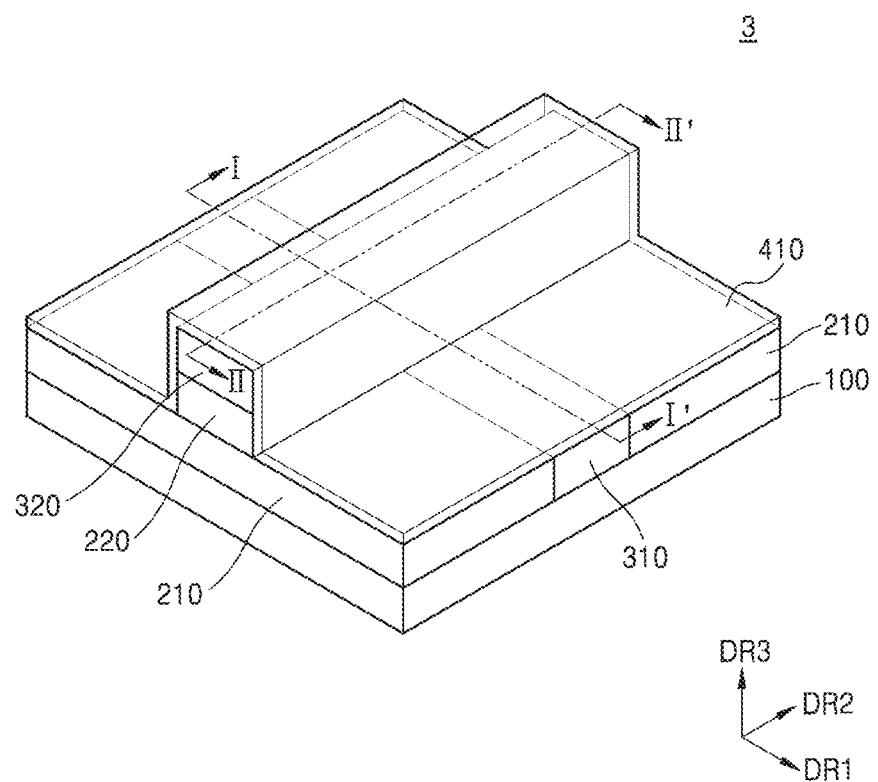
FIG. 3 is a perspective view of a variable resistance memory device according to some example embodiments.
Figure 4A:
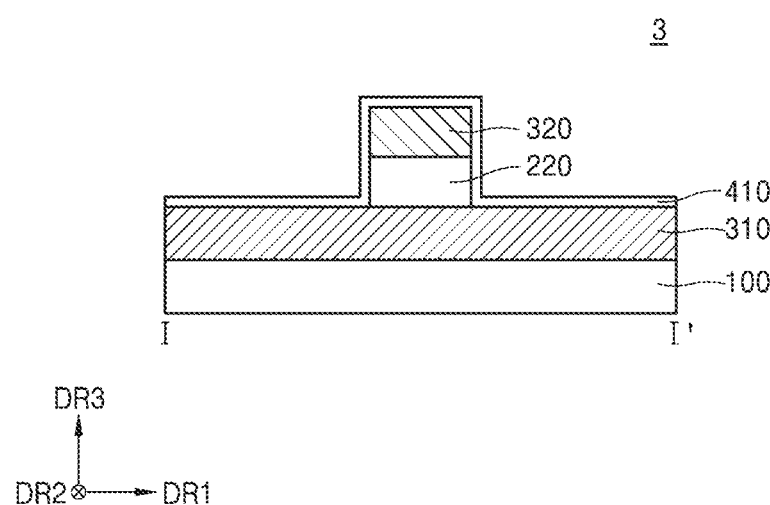
FIG. 4A is a cross-sectional view taken along line I-I' of FIG. 3.
Figure 4B:
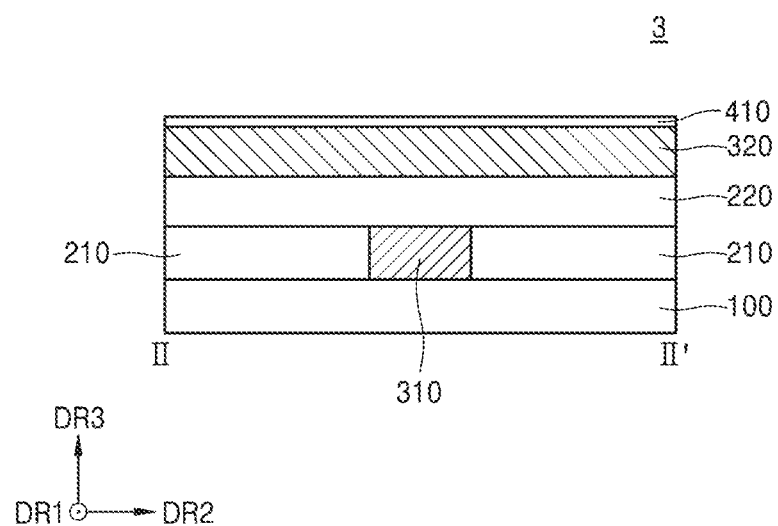
FIG. 4B is a cross-sectional view taken along line II-II' in FIG. 3.

FIG. 3 is a perspective view of a variable resistance memory device 3 according to some example embodiments. FIG. 4A is a cross-sectional view taken along line I-I' of FIG. 3. FIG. 4B is a cross-sectional view taken along line II-II' in FIG. 3. For brevity of description, substantially the same descriptions as those given with reference to FIGS. 1 and 2 may be omitted.

Referring to FIGS. 3, 4A, and 4B, the variable resistance memory device 3 including the substrate 100, the first insulating layer 210, the fixed resistance layer 220, the first conductive line 310, the second conductive line 320, and the variable resistance layer 410 may be provided. The variable resistance memory device 3 may correspond to each of the memory devices MC shown in FIG. 1 and components adjacent thereto. In some example embodiments, a plurality of variable resistance memory devices 3 may be arranged in the first direction DR1 and the second direction DR2 to form the variable resistance memory device (1 in FIG. 1) shown in FIG. 1.

The substrate 100 may include an insulating material. For example, the substrate 100 may include at least one of silicon oxide, silicon nitride, and/or silicon oxynitride.

The first insulating layer 210 may be provided on the substrate 100. The first insulating layer 210 may include a trench extending in the first direction DR1. The trench may expose the substrate 100. For example, the first insulating layer 210 may include at least one of $SiO_2$, $Al_2O_3$, and/or $HfO_2$.

The first conductive line 310 may be provided in the trench. The first conductive line 310 may extend in the first direction DR1. An upper surface of the first conductive line 310 may be coplanar or substantially coplanar (e.g., coplanar within manufacturing tolerances and/or material tolerances) with an upper surface of the first insulating layer 210. The upper surface of the first conductive line 310 and the upper surface of the first insulating layer 210 may be disposed at the same level. An electrical characteristic of the first conductive line 310 and a material of the first conductive line 310 may be substantially the same as those described with reference to FIG. 2. The first conductive lines 310 may be the bit lines (BL1, BL2, and BL3 of FIG. 1) described with reference to FIG. 1.

The fixed resistance layer 220 may be provided on the first insulating layer 210. Unlike that described with reference to FIG. 2, the fixed resistance layer 220 may extend in the second direction DR2. In a plan view, the fixed resistance layer 220 may intersect with the first insulating layer 210 and the first conductive line 310. Hereinafter, the plan view may be a view in a direction opposite to the third direction DR3. The first insulating layer 210 and the first conductive line 310 may be exposed from both sides of the fixed resistance layer 220. The fixed resistance layer 220 may be in contact with the first insulating layer 210 and the first conductive line 310. The fixed resistance layer 220 may be electrically connected to the first conductive line 310 and the second conductive line 320. For example, the fixed resistance layer 220 may be in direct contact with a top surface of the first conductive line 310 and a bottom surface of the second conductive line 320. An electrical characteristic of the fixed resistance layer 220 and a material of the fixed resistance layer 220 may be substantially the same as those described with reference to FIG. 2.

The second conductive line 320 may be provided on the fixed resistance layer 220. The second conductive line 320 may overlap the fixed resistance layer 220 in the third direction DR3. The second conductive line 320 may extend in the second direction DR2. In a plan view, the second conductive line 320 may intersect with the first insulating layer 210 and the first conductive line 310. An electrical characteristic of the second conductive line 320 and a material of the second conductive line 320 may be substantially the same as those described with reference to FIG. 2. The second conductive lines 320 may be the word lines (WL1, WL2, and WL3 in FIG. 1) described with reference to FIG. 1.

The variable resistance layer 410 may be provided on the second conductive line 320, the fixed resistance layer 220, the first insulating layer 210, and the first conductive line 310. The variable resistance layer 410 may extend along surfaces of the second conductive line 320, the fixed resistance layer 220, the first insulating layer 210, and the first conductive line 310. For example, the variable resistance layer 410 may conformally cover the second conductive line 320, the fixed resistance layer 220, the first insulating layer 210, and the first conductive line 310. For the purpose of description, the variable resistance layer 410 is shown as being transparent, but this is not limited. In some example embodiments, the variable resistance layer 410 may be opaque or translucent. The variable resistance layer 410 may be electrically connected to the first conductive line 310 and the second conductive line 320. For example, the variable resistance layer 410 may be in direct contact with the top surface of the first conductive line 310 and the bottom surface of the second conductive line 320. An electrical characteristic of the variable resistance layer 410 and a material of the variable resistance layer 410 may be substantially the same as those described with reference to FIG. 2. The fixed resistance layer 220 and the variable resistance layer 410 may be connected in parallel between the first conductive line 310 and the second conductive line 320.

In some example embodiments, the variable resistance layer 410 and the fixed resistance layer 220 may be replaced with each other. In other words, in some example embodiments, for example, in FIGS. 3, 4A, and 4B, a configuration shown as the fixed resistance layer 220 may include a material having a variable resistance characteristic, and a configuration shown as the variable resistance layer 410 may include a material having a fixed resistance characteristic.

Some example embodiments may include the fixed resistance layer 220 and the variable resistance layer 410 electrically connected in parallel between the first conductive line 310 and the second conductive line 320. A degree of unevenness in the resistance change (a resistance change of the memory device MC in FIG. 1) between the first conductive line 310 and the second conductive line 320 may be reduced by the fixed resistance layer 220. Accordingly, the variable resistance memory device 3, which is highly reliable, may be provided.

Figure 5A:
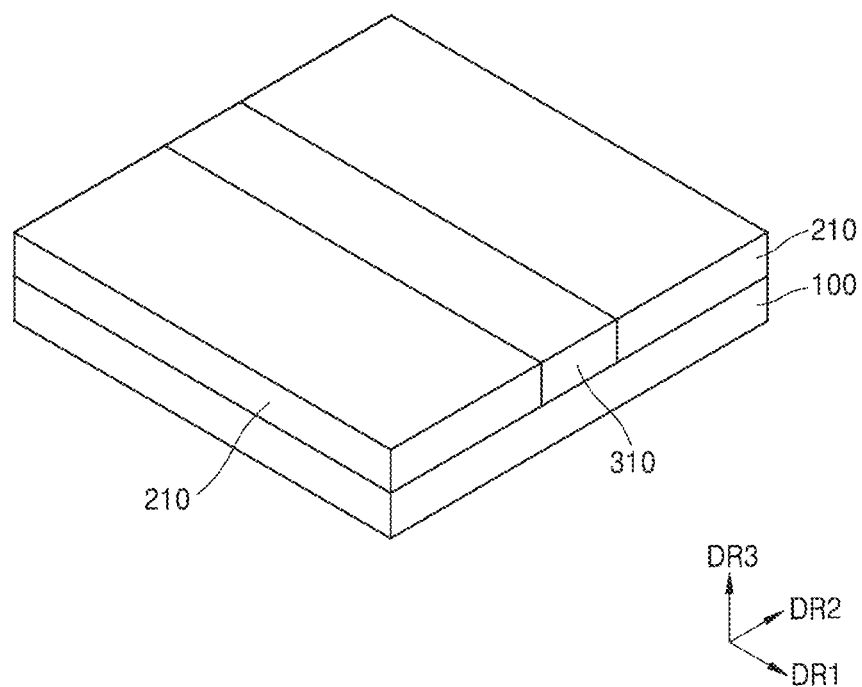
FIGS. 5A and 5B are perspective views illustrating a method of manufacturing a variable resistance memory device of FIG. 3.
Figure 5B:
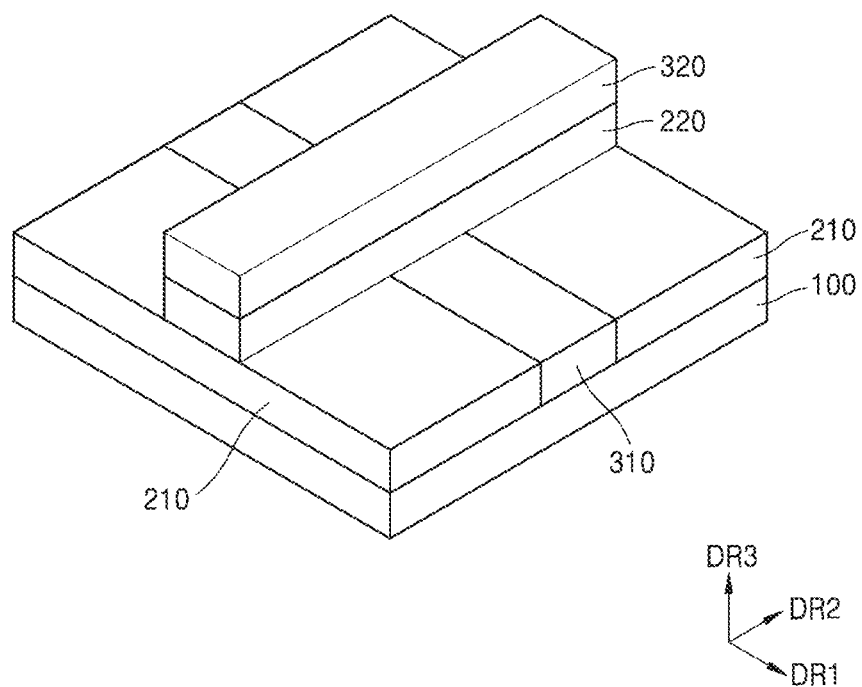

FIGS. 5A and 5B are perspective views illustrating a method of manufacturing the variable resistance memory device 3 of FIG. 3.

Referring to FIG. 5A, the substrate 100 may be prepared. The substrate 100 may include an insulating material. For example, the substrate 100 may include at least one of silicon oxide, silicon nitride, and/or silicon oxynitride.

The first insulating layer 210 may be provided on the substrate 100. A process of forming the first insulating layer 210 may include depositing the insulating material on the substrate 100. For example, the deposition process may include a physical vapor deposition process or a chemical vapor deposition process. For example, the first insulating layer 210 may include at least one of $SiO_2$, $Al_2O_3$, and/or $HfO_2$.

A trench extending in the first direction DR1 may be formed in the first insulating layer 210. A process of forming the trench may include performing an etching process using an etching mask (not shown) on the first insulating layer 210. The etching process may be performed until the substrate 100 is exposed. An etch mask may be removed during or after the etching process.

The first conductive line 310 may be formed in the trench. A process of forming the first conductive line 310 may include forming a conductive material layer (not shown) filling the trenches on the first insulating layer 210 and performing a planarization process on the conductive material layer. For example, the planarization process may include a chemical mechanical polishing (CMP) process. An upper portion of the first insulating layer 210 may also be planarized during the planarization process. The first conductive line 310 may include at least one of metal (e.g., titanium (Ti), titanium nitride (TiN), tungsten (W), platinum (Pt), tantalum nitride (Al), and/or aluminum (Al)) and a doped semiconductor material (e.g., doped Si, doped IGZO, and/or doped GaAs).

Referring to FIG. 5B, the fixed resistance layer 220 and the second conductive line 320 may be formed on the first insulating layer 210. A process of forming the fixed resistance layer 220 and the second conductive line 320 may include sequentially depositing an insulating material layer (not shown) and a conductive material layer (not shown) on the first insulating layer 210 and performing an etching process using an etch mask on the insulating material layer and the conductive material layer. For example, the deposition process may include a chemical vapor deposition (CVD) process, an atomic layer deposition (ALD) process, or a physical vapor deposition (PVD) process.

The etching process may be performed until the first insulating layer 210 and the first conductive line 310 are exposed. The fixed resistance layer 220 may include a fixed resistance. For example, the fixed resistance layer 220 may include at least one of $SiO_2$, $Al_2O_3$, and/or $HfO_2$. The second conductive line 320 may include at least one of metal (e.g., titanium (Ti), titanium nitride (TiN), tungsten (W), platinum (Pt), tantalum nitride (Al), and/or aluminum (Al)), and a doped semiconductor material (e.g., doped Si, doped IGZO, and/or doped GaAs).

Referring again to FIG. 3, the variable resistance layer 410 may be formed. A process of forming the variable resistance layer 410 may include a deposition process. The deposition process may include a CVD process, a PVD process, or an ALD process. For example, the variable resistance layer 410 may be formed to conformally cover surfaces of the first insulating layer 210, the first conductive line 310, the fixed resistance layer 220, and the second conductive line 320. In some example embodiments, the variable resistance layer 410 may include a dielectric layer in which an oxygen vacancy may move. For example, the variable resistance layer 410 may include an oxide layer or a nitride layer. When the variable resistance layer 410 includes the oxide layer, the variable resistance layer 410 may include at least one of, for example, $HfO_2$, $Al_2O_3$, $Ta_2O_5$, $TiO_2$, and/or $ZrO_2$. When the variable resistance layer 410 includes the nitride layer, the variable resistance layer 410 may include, for example, SiN. In some example embodiments, the variable resistance layer 410 may include a phase change material. For example, the variable resistance layer 410 may include GST ($Ge_2Sb_2Te_5$).

Some example embodiments may provide the method of manufacturing a highly reliable variable resistance memory device.

Figure 6:
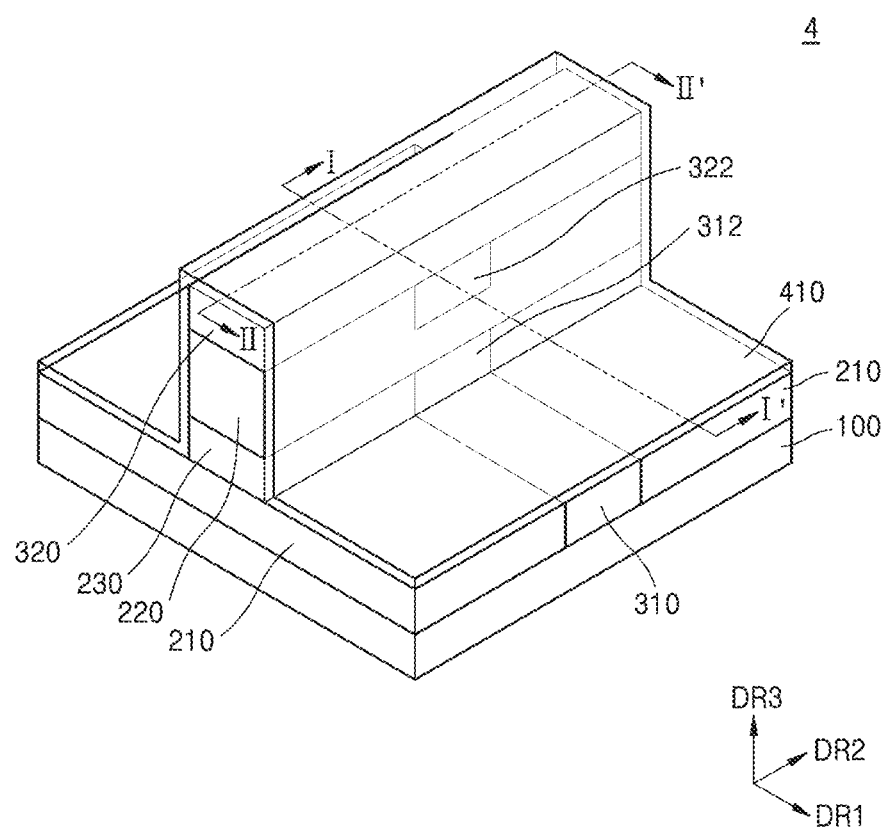
FIG. 6 is a perspective view of a variable resistance memory device according to some example embodiments.
Figure 7A:
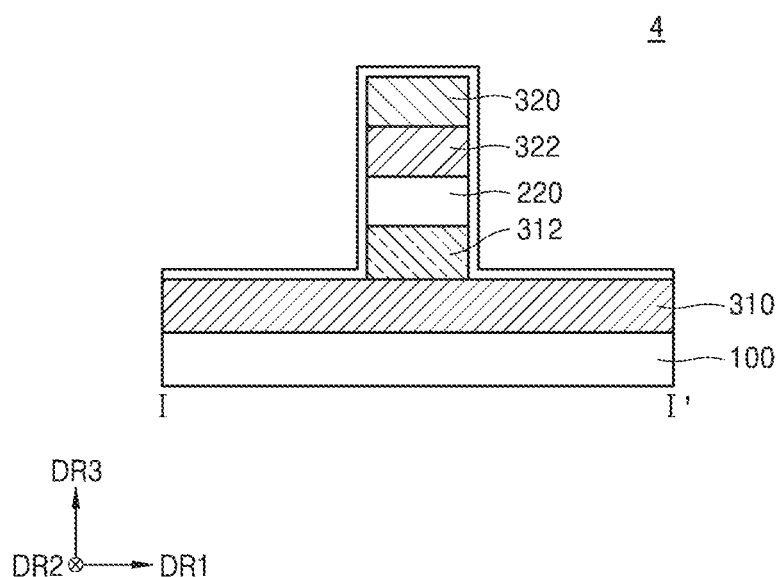
FIG. 7A is a cross-sectional view taken along line I-I' of FIG. 6.
Figure 7B:
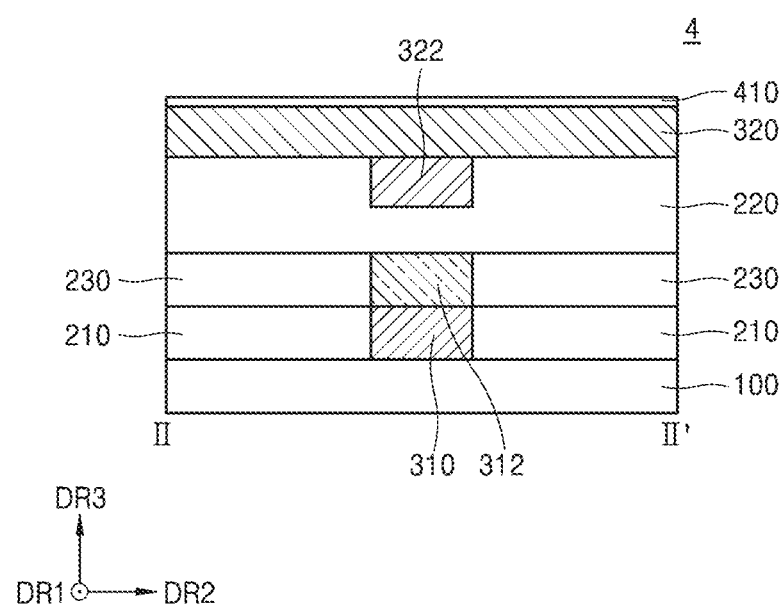
FIG. 7B is a cross-sectional view taken along line II-II' in FIG. 6.

FIG. 6 is a perspective view of a variable resistance memory device 4 according to some example embodiments. FIG. 7A is a cross-sectional view taken along line I-I' of FIG. 6. FIG. 7B is a cross-sectional view taken along line II-II' in FIG. 6. For brevity of description, substantially the same descriptions as those given with reference to FIGS. 1, 2, 3, 4A and 4B may be omitted.

Referring to FIGS. 6, 7A, and 7B, the variable resistance memory device 4 including the substrate 100, the first insulating layer 210, the fixed resistance layer 220, the first conductive line 310, a first electrode pattern 312, the second conductive line 320, a second electrode pattern 322, a second insulating layer 230, and the variable resistance layer 410 may be provided. The variable resistance memory device 4 may correspond to each of the memory devices MC shown in FIG. 1 and components adjacent thereto. In some example embodiments, a plurality of variable resistance memory devices 4 may be arranged in the first direction DR1 and the second direction DR2 to form the variable resistance memory device (1 in FIG. 1) shown in FIG. 1. The substrate 100, the first insulating layer 210, the first conductive line 310, and the second conductive line 320 may be substantially the same as those described with reference to FIGS. 3, 4A, and 4B.

The first electrode pattern 312 may be provided between the first conductive line 310 and the second conductive line 320. The first electrode pattern 312 may be provided in a region where the first conductive line 310 and the second conductive line 320 intersect each other. The first electrode pattern 312 may overlap the first conductive line 310 and the second conductive line 320 in the third direction DR3. The first electrode pattern 312 may extend in the third direction DR3. The first electrode pattern 312 may be electrically connected to the first conductive line 310. The first electrode pattern 312 may be in direct contact with an upper surface of the first conductive line 310. In some example embodiments, the first electrode pattern 312 and the first conductive line 310 may comprise a single structure. In other words, the first electrode pattern 312 and the first conductive line 310 may not have a boundary therebetween.

The first electrode pattern 312 may have a rectangular column shape. However, a shape of the first electrode pattern 312 is not limited to the rectangular column shape. In some example embodiments, the first electrode pattern 312 may have a polygonal column shape rather than the rectangular column shape. The first electrode pattern 312 may include a conductive material. For example, the first electrode pattern 312 may include at least one of metal (e.g., titanium (Ti), titanium nitride (TiN), tungsten (W), platinum (Pt), tantalum nitride (Al), and/or aluminum (Al)) and a doped semiconductor material (e.g., doped Si, doped IGZO, and/or doped GaAs).

The second insulating layer 230 may be provided on the first insulating layer 210. The second insulating layer 230 may extend in the second direction DR2. The second insulating layer 230 may be in contact with side surfaces of the first electrode pattern 312 extending in the first direction DR1. The second insulating layer 230 may expose an upper surface of the first electrode pattern 312. An upper surface of the second insulating layer 230 may be coplanar or substantially coplanar (e.g., coplanar within manufacturing tolerances and/or material tolerances) with the upper surface of the first electrode pattern 312. Side surfaces of the second insulating layer 230 in the second direction DR2 may be coplanar or substantially coplanar (e.g., coplanar within manufacturing tolerances and/or material tolerances) with the side surfaces of the first electrode pattern 312 in the second direction DR2. The second insulating layer 230 and the first electrode pattern 312 may expose the first insulating layer 210 and the first conductive line 310 on both sides thereof. For example, the second insulating layer 230 may include at least one of $SiO_2$, $Al_2O_3$, and/or $HfO_2$.

The second electrode pattern 322 may be provided between the first electrode pattern 312 and the second conductive line 320. The second electrode pattern 322 may be provided in a region where the first conductive line 310 and the second conductive line 320 intersect each other. In a plan view, the second electrode pattern 322 may overlap the first electrode pattern 312. The second electrode pattern 322 may extend in the third direction DR3. The second electrode pattern 322 may be electrically connected to the second conductive line 320. The second electrode pattern 322 may be in direct contact with a bottom surface of the second conductive line 320. In some example embodiments, the second electrode pattern 322 and the second conductive line 320 may comprise a single structure. In other words, the second electrode pattern 322 and the second conductive line 320 may not have a boundary therebetween.

The second electrode pattern 322 may have a rectangular column shape. However, a shape of the second electrode pattern 322 is not limited to the rectangular column shape. In some example embodiments, the second electrode pattern 322 may have a polygonal column shape rather than the rectangular column shape. The second electrode pattern 322 may include a conductive material. For example, the second electrode pattern 322 may include at least one of metal (e.g., titanium (Ti), titanium nitride (TiN), tungsten (W), platinum (Pt), tantalum nitride (Al), and/or aluminum (Al)) and a doped semiconductor material (e.g., doped Si, doped IGZO, and/or doped GaAs).

The fixed resistance layer 220 may be provided on the second insulating layer 230 and the first electrode pattern 312. The fixed resistance layer 220 may extend in the second direction DR2 and may intersect with the first electrode pattern 312 and the second electrode pattern 322. The fixed resistance layer 220 may extend across a region between the first electrode pattern 312 and the second electrode pattern 322. The region between the first electrode pattern 312 and the second electrode pattern 322 may be a region where the first conductive line 310 and the second conductive line 320 intersect. The fixed resistance layer 220 may be electrically connected to the first electrode pattern 312 and the second electrode pattern 322. For example, the fixed resistance layer 220 may be in direct contact with the first electrode pattern 312 and the second electrode pattern 322.

The fixed resistance layer 220 may surround a bottom surface of the second electrode pattern 322 and side surfaces in the first direction DR1. The fixed resistance layer 220 may expose an upper surface of the second electrode pattern 322. The upper surface of the fixed resistance layer 220 may be coplanar or substantially coplanar (e.g., coplanar within manufacturing tolerances and/or material tolerances) with the upper surface of the second electrode pattern 322. A thickness of the fixed resistance layer 220 in the third direction DR3 may be smaller in the region between the first electrode pattern 312 and the second electrode pattern 322 than a region between the second insulating layer 230 and the second conductive line 320. An electrical characteristic of the fixed resistance layer 220 and a material of the fixed resistance layer 220 may be substantially the same as those described with reference to FIG. 2.

The variable resistance layer 410 may cover surfaces of the second insulating layer 230, the fixed resistance layer 220, the second electrode pattern 322, and the second conductive line 320. In some example embodiments, the variable resistance layer 410 may conformally extend along the surfaces of the second insulating layer 230, the fixed resistance layer 220, the second electrode pattern 322, and the second conductive line 320. The variable resistance layer 410 may be electrically connected to the first electrode pattern 312 and the second electrode pattern 322. For example, the variable resistance layer 410 may be in direct contact with side surfaces of the first electrode pattern 312 and the second electrode pattern 322. An electrical characteristic of the variable resistance layer 410 and a material of the variable resistance layer 410 may be substantially the same as those described with reference to FIG. 2.

In some example embodiments, the variable resistance layer 410 and the fixed resistance layer 220 may be replaced with each other. In other words, in some example embodiments, for example, in FIGS. 6, 7A, and 7B, a configuration shown as the fixed resistance layer 220 may include a material having a variable resistance characteristic, and a configuration shown as the variable resistance layer 410 may include a material having a fixed resistance characteristic.

Some example embodiments may include the fixed resistance layer 220 and the variable resistance layer 410 that are electrically connected in parallel between the first electrode pattern 312 and the second electrode pattern 322. A degree of unevenness in a resistance change (a resistance change of the memory device MC in FIG. 1) between the first electrode pattern 312 and the second electrode pattern 322 may be reduced by the fixed resistance layer 220. Accordingly, the variable resistance memory device 4, which is highly reliable, may be provided.

Figure 8:
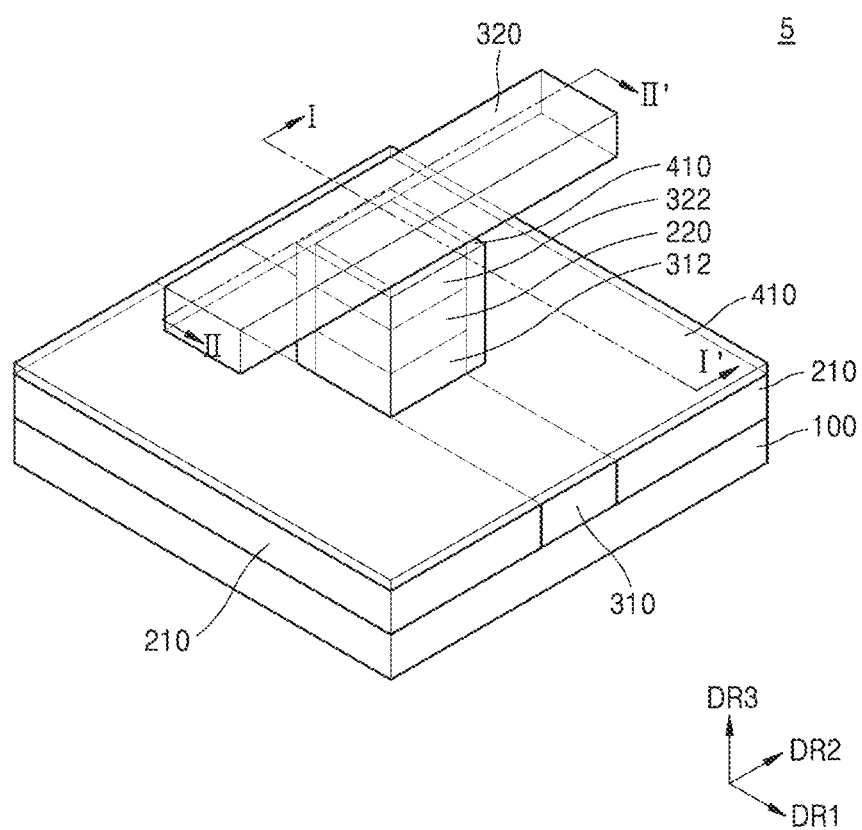
FIG. 8 is a perspective view of a variable resistance memory device according to some example embodiments.
Figure 9A:
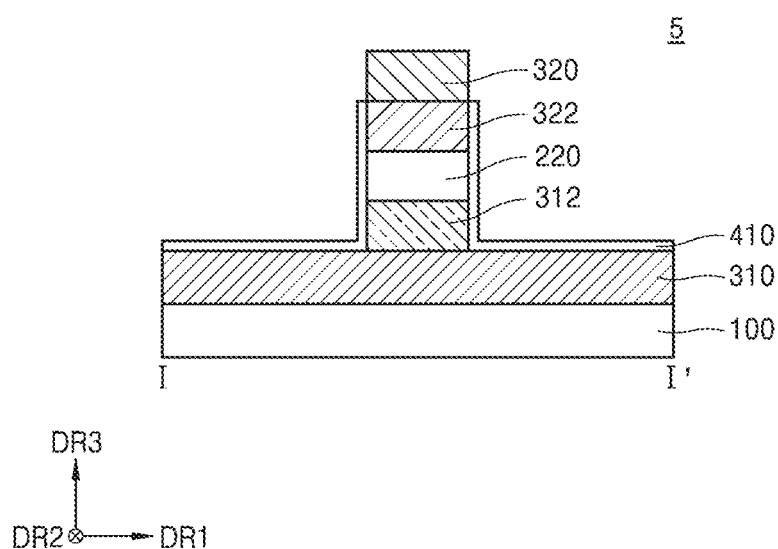
FIG. 9A is a cross-sectional view taken along line I-I' of FIG. 8.
Figure 9B:
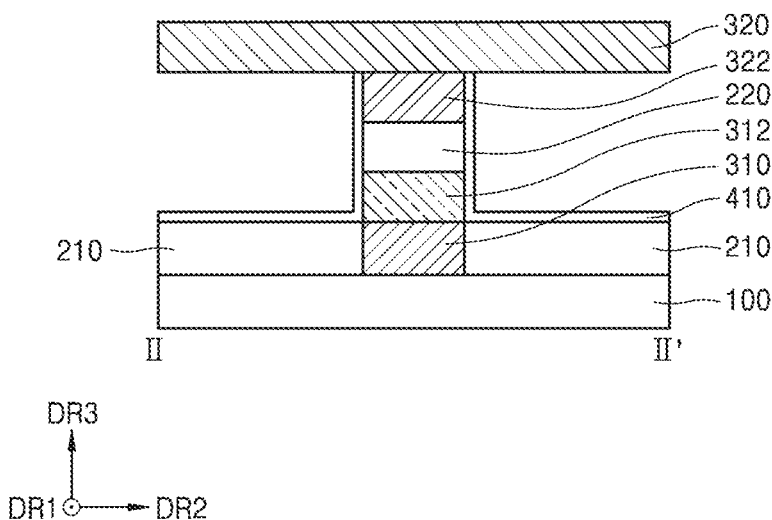
FIG. 9B is a cross-sectional view taken along line II-II' in FIG. 8.

FIG. 8 is a perspective view of a variable resistance memory device 5 according to some example embodiments. FIG. 9A is a cross-sectional view taken along line I-I' of FIG. 8. FIG. 9B is a cross-sectional view taken along line II-II' in FIG. 8. For brevity of description, substantially the same descriptions as those given with reference to FIGS. 1, 2, 3, 4A, 6, 7A, and 7B may be omitted.

Referring to FIGS. 8, 9A, and 9B, the variable resistance memory device 5 including the substrate 100, the first insulating layer 210, the fixed resistance layer 220, the first conductive line 310, the first electrode pattern 312, the second conductive line 320, the second electrode pattern 322, and the variable resistance layer 410 may be provided. The variable resistance memory device 5 may correspond to each of the memory devices MC shown in FIG. 1 and components adjacent thereto. In some example embodiments, a plurality of variable resistance memory devices 5 may be arranged in the first direction DR1 and the second direction DR2 to form the variable resistance memory device (1 in FIG. 1) shown in FIG. 1. The substrate 100, the first insulating layer 210, the first conductive line 310, and the second conductive line 320 may be substantially the same as those described with reference to FIGS. 3, 4A, and 4B. The first electrode pattern 312 and the second electrode pattern 322 may be substantially the same as those described with reference to FIGS. 6, 7A, and 7B.

The fixed resistance layer 220 may be between the first electrode pattern 312 and the second electrode pattern 322. In a plan view, the fixed resistance layer 220 may overlap the first electrode pattern 312 and the second electrode pattern 322. The fixed resistance layer 220 may be electrically connected to the first electrode pattern 312 and the second electrode pattern 322. For example, the fixed resistance layer 220 may be in direct contact with the first electrode pattern 312 and the second electrode pattern 322. Side surfaces of the fixed resistance layer 220 may be coplanar or substantially coplanar (e.g., coplanar within manufacturing tolerances and/or material tolerances) with side surfaces of the first electrode pattern 312 and the second electrode pattern 322 that are directly adjacent thereto. The fixed resistance layer 220 may have a rectangular column shape. However, a shape of the fixed resistance layer 220 is not limited to the rectangular column shape. In some example embodiments, the fixed resistance layer 220 may have a polygonal column shape rather than the rectangular column shape. An electrical characteristic of the fixed resistance layer 220 and a material of the fixed resistance layer 220 may be substantially the same as those described with reference to FIG. 2.

The variable resistance layer 410 may be provided on the first insulating layer 210 and the first conductive line 310. The variable resistance layer 410 may extend along an upper surface of the first insulating layer 210 and an upper surface of the first conductive line 310. The variable resistance layer 410 may extend along side surfaces of the first electrode pattern 312, the fixed resistance layer 220, and the second electrode pattern 322. The variable resistance layer 410 may surround the side surfaces of the first electrode pattern 312, the fixed resistance layer 220, and the second electrode pattern 322. For example, the variable resistance layer 410 may conformally cover the side surfaces of the first electrode pattern 312, the fixed resistance layer 220, and the second electrode pattern 322. The variable resistance layer 410 may be electrically connected to the first electrode pattern 312 and the second electrode pattern 322. For example, the variable resistance layer 410 may be in direct contact with the side surfaces of the first electrode pattern 312 and the second electrode pattern 322. The variable resistance layer 410 may expose an upper surface of the second electrode pattern 322. An upper surface of the variable resistance layer 410 may be coplanar or substantially coplanar (e.g., coplanar within manufacturing tolerances and/or material tolerances) with the upper surface of the second electrode pattern 322. An electrical characteristic of the variable resistance layer 410 and a material of the variable resistance layer 410 may be substantially the same as those described with reference to FIG. 2.

An insulating layer (not shown) may be provided between the second conductive line 320 and the variable resistance layer 410.

In some example embodiments, the variable resistance layer 410 and the fixed resistance layer 220 may be replaced with each other. In other words, in some example embodiments, such as the configuration shown in FIGS. 8, 9A, and 9B as the fixed resistance layer 220 may include a material having a variable resistance characteristic, and a configuration shown as the variable resistance layer 410 may include a material having a fixed resistance characteristic.

Some example embodiments may include the fixed resistance layer 220 and the variable resistance layer 410 electrically connected in parallel between the first electrode pattern 312 and the second electrode pattern 322. A degree of unevenness in the resistance change (a resistance change of the memory device MC in FIG. 1) between the first electrode pattern 312 and the second electrode pattern 322 may be reduced by the fixed resistance layer 220. Accordingly, the variable resistance memory device 5, which is highly reliable, may be provided.

Figure 10:
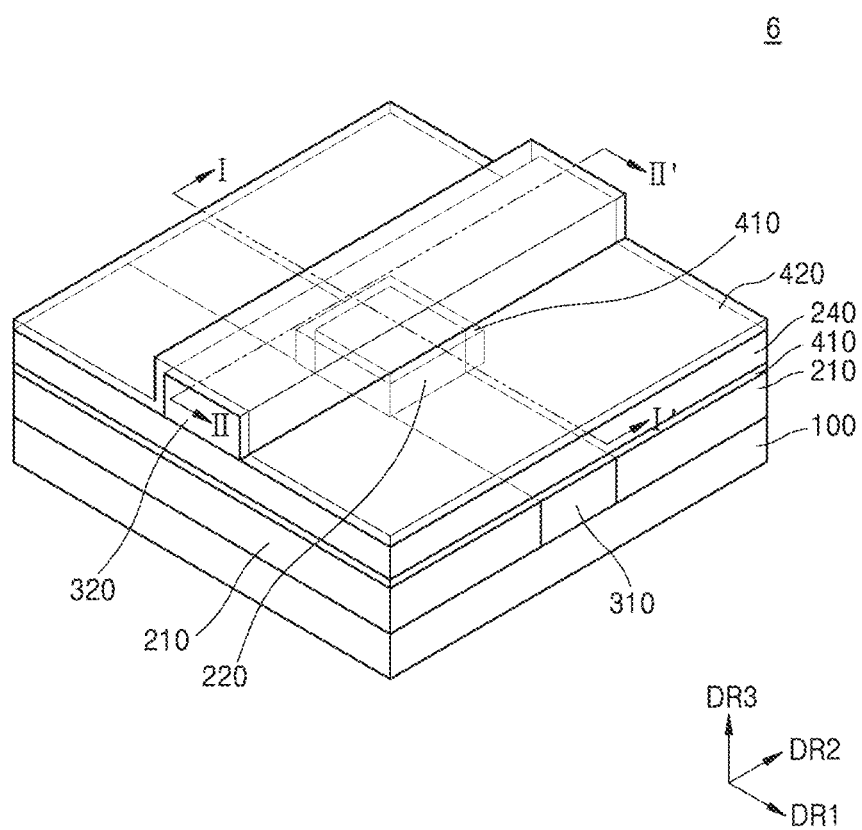
FIG. 10 is a perspective view of a variable resistance memory device according to some example embodiments.
Figure 11A:
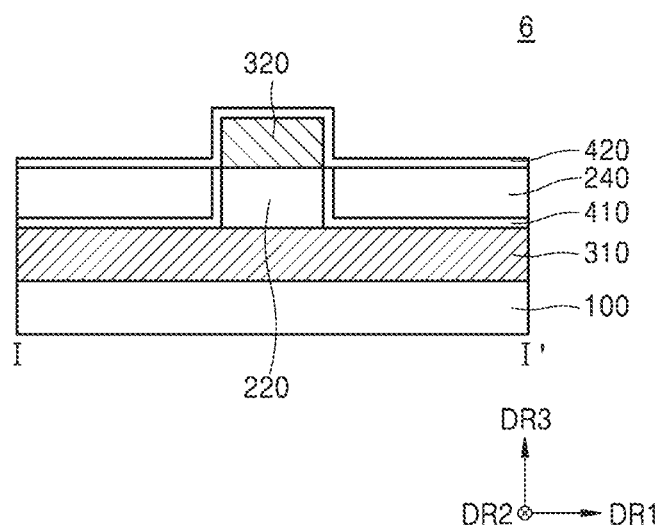
FIG. 11A is a cross-sectional view taken along line I-I' of FIG. 10.
Figure 11B:
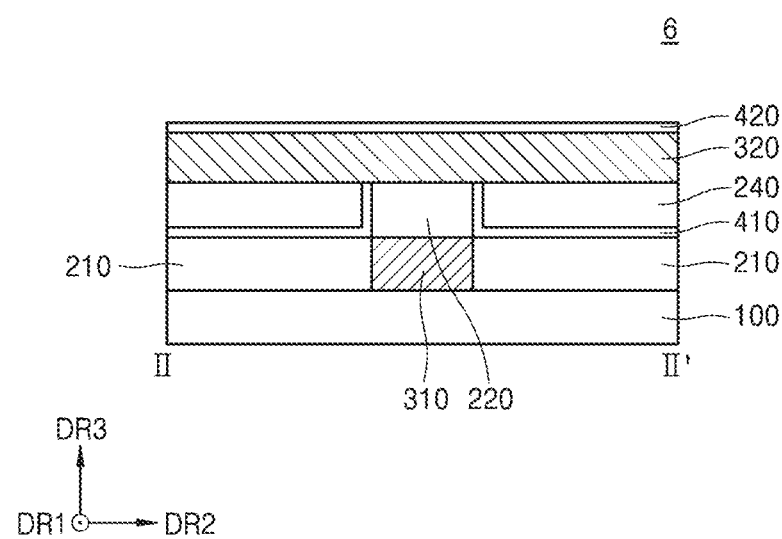
FIG. 11B is a cross-sectional view taken along line II-II' in FIG. 10.

FIG. 10 is a perspective view of a variable resistance memory device 6 according to some example embodiments. FIG. 11A is a cross-sectional view taken along line I-I' of FIG. 10. FIG. 11B is a cross-sectional view taken along line II-II' in FIG. 10. For brevity of description, substantially the same descriptions as those given with reference to FIGS. 1, 2, 3, 4A, and 4B may be omitted.

Referring to FIGS. 10, 11A, and 11B, the variable resistance memory device 6 including the substrate 100, the first insulating layer 210, the fixed resistance layer 220, the first conductive line 310, the second conductive line 320, the second electrode pattern 322, the variable resistance layer 410, and an additional variable resistance layer 420 may be provided. The variable resistance memory device 6 may correspond to each of the memory devices MC shown in FIG. 1 and components adjacent thereto. In some example embodiments, a plurality of variable resistance memory devices 6 may be arranged in the first direction DR1 and the second direction DR2 to form the variable resistance memory device (1 in FIG. 1) shown in FIG. 1. The substrate 100, the first insulating layer 210, and the first conductive line 310 may be substantially the same as those described with reference to FIGS. 3, 4A, and 4B.

The fixed resistance layer 220 may be provided between the first conductive line 310 and the second conductive line 320. The fixed resistance layer 220 may be provided in a region where the first conductive line 310 and the second conductive line 320 intersect each other. In a plan view, the fixed resistance layer 220 may overlap the first electrode pattern 312 and the second electrode pattern 322. The fixed resistance layer 220 may have a rectangular column shape. However, a shape of the fixed resistance layer 220 is not limited to the rectangular column shape. In some example embodiments, the fixed resistance layer 220 may have a polygonal column shape rather than the rectangular column shape. An electrical characteristic of the fixed resistance layer 220 and a material of the fixed resistance layer 220 may be substantially the same as those described with reference to FIG. 2.

The variable resistance layer 410 may be provided on the first insulating layer 210 and the first conductive line 310. The variable resistance layer 410 may be electrically connected to the first conductive line 310. For example, the variable resistance layer 410 may be in direct contact with an upper surface of the first conductive line 310. The variable resistance layer 410 may extend along side surfaces of the fixed resistance layer 220. The variable resistance layer 410 may surround the side surfaces of the fixed resistance layer 220. For example, the variable resistance layer 410 may conformally cover the side surfaces of the fixed resistance layer 220. The variable resistance layer 410 may be in direct contact with the side surfaces of the fixed resistance layer 220. The variable resistance layer 410 may expose an upper surface of the fixed resistance layer 220. An uppermost surface of the variable resistance layer 410 may be coplanar or substantially coplanar (e.g., coplanar within manufacturing tolerances and/or material tolerances) with the upper surface of the fixed resistance layer 220. An electrical characteristic of the variable resistance layer 410 and a material of the variable resistance layer 410 may be substantially the same as the electrical characteristic of the variable resistance layer 410 and the material of the variable resistance layer 410 described with reference to FIG. 2 respectively.

A third insulating layer 240 may be provided on the variable resistance layer 410. The third insulating layer 240 may expose the uppermost surface of the variable resistance layer 410 and the upper surface of the fixed resistance layer 220. An upper surface of the third insulating layer 240, the uppermost surface of the variable resistance layer 410 and the upper surface of the fixed resistance layer 220 may be coplanar or substantially coplanar (e.g., coplanar within manufacturing tolerances and/or material tolerances) with each other. For example, the third insulating layer 240 may include at least one of $SiO_2$, $Al_2O_3$, and/or $HfO_2$.

The second conductive line 320 may extend in the second direction DR2 on the fixed resistance layer 220. The second conductive line 320 may expose an uppermost surface of a part of the variable resistance layer 410 provided on the side surfaces of the fixed resistance layer 220 in the second direction DR2. A part of the variable resistance layer 410 provided on the side surfaces of the fixed resistance layer 220 in the first direction DR1 may be electrically connected to the second conductive line 320. For example, an uppermost surface of the part of the variable resistance layer 410 provided on the side surfaces of the fixed resistance layer 220 in the first direction DR1 may be in direct contact with a bottom surface of the second conductive line 320.

The additional variable resistance layer 420 may be provided on the second conductive line 320, the third insulating layer 240, fixed resistance layer 220, and the variable resistance layer 410. The additional variable resistance layer 420 may extend along surfaces of the second conductive line 320, the third insulating layer 240, the fixed resistance layer 220, and the variable resistance layer 410. The additional variable resistance layer 420 may conformally cover the second conductive line 320, the third insulating layer 240, the fixed resistance layer 220, and the variable resistance layer 410.

The additional variable resistance layer 420 may be electrically connected to the variable resistance layer 410. The additional variable resistance layer 420 may be in direct contact with the uppermost surface of the variable resistance layer 410. The additional variable resistance layer 420 may include substantially the same material as that of the variable resistance layer 410. The additional variable resistance layer 420 may include a dielectric layer in which an oxygen vacancy may move. For example, the additional variable resistance layer 420 may include an oxide layer or a nitride layer. When the additional variable resistance layer 420 includes the oxide layer, the variable resistance layer 410 may include at least one of, for example, $HfO_2$, $Al_2O_3$, $Ta_2O_5$, $TiO_2$, and/or $ZrO_2$. When the additional variable resistance layer 420 includes the nitride layer, the variable resistance layer 410 may include, for example, SiN. In some example embodiments, the additional variable resistance layer 420 may include a phase change material. For example, the additional variable resistance layer 420 may include GST ($Ge_2Sb_2Te_5$).

The variable resistance layer 410 and the additional variable resistance layer 420 may comprise one variable resistance layer electrically connected to the first conductive line 310 and the second conductive line 320. The one variable resistance layer may be electrically connected in parallel with the fixed resistance layer 220 between the first conductive line 310 and the second conductive line 320.

In some example embodiments, the variable resistance layer 410 and the additional variable resistance layer 420 may be replaced with the fixed resistance layer 220, and the fixed resistance layer 220 may be replaced with the variable resistance layer 410 or the additional variable resistance layer 420. In other words, in some example embodiments, for example, in FIGS. 10, 11A, and 11B, a configuration shown as the fixed resistance layer 220 may include a material of the variable resistance layer 410 or the additional variable resistance layer 420, and configurations shown as the variable resistance layer 410 and the additional variable resistance layer 420 may include a material having a fixed resistance characteristic.

Some example embodiments may include the fixed resistance layer 220 and the variable resistance layer 410 and the additional variable resistance layer 420 that are electrically connected in parallel between the first conductive line 310 and the second conductive line 320. A degree of unevenness in a resistance change (a resistance change of the memory device MC in FIG. 1) between the first conductive line 310 and the second conductive line 320 may be reduced by the fixed resistance layer 220. Accordingly, the variable resistance memory device 6, which is highly reliable, may be provided.

Figure 12:
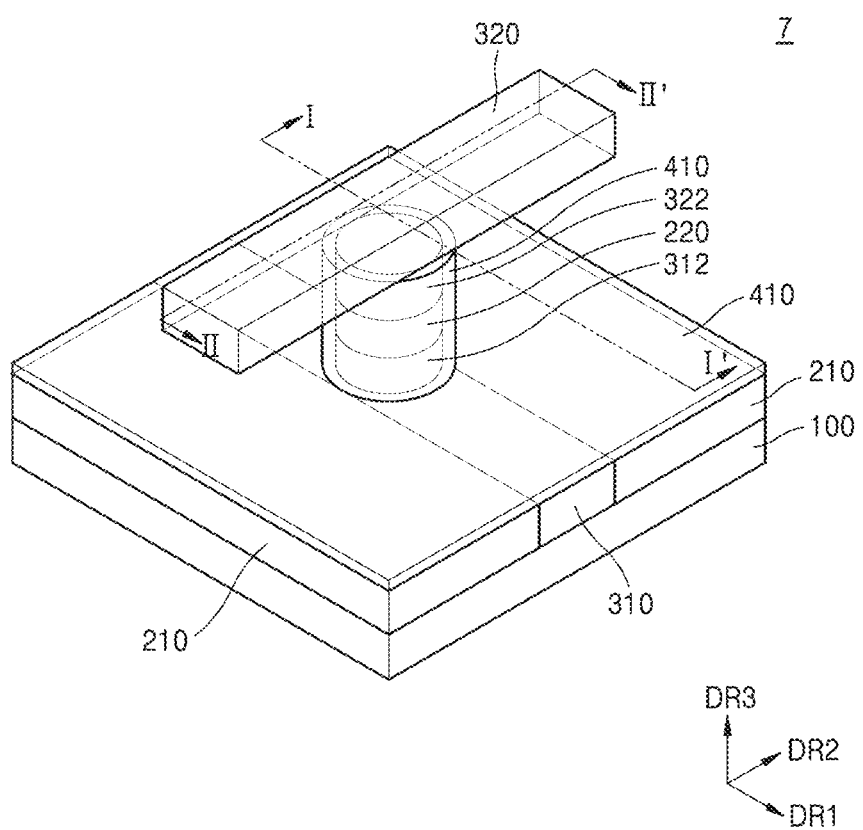
FIG. 12 is a perspective view of a variable resistance memory device according to some example embodiments.

FIG. 12 is a perspective view of a variable resistance memory device 7 according to some example embodiments. For brevity of description, substantially the same descriptions as those given with reference to FIGS. 1, 2, 3, 4A, 4B, 8, 9A, and 9B may be omitted. A cross-sectional view taken along line I-I' of FIG. 12 is the same as that of FIG. 9A. A cross-sectional view taken along line II-II' of FIG. 12 is the same as that of FIG. 9B.

Referring to FIG. 12, the variable resistance memory device 7 including the substrate 100, the first insulating layer 210, the fixed resistance layer 220, the first conductive line 310, the first electrode pattern 312, the second conductive line 320, the second electrode pattern 322, and the variable resistance layer 410 may be provided. The variable resistance memory device 7 may correspond to each of the memory devices MC shown in FIG. 1 and components adjacent thereto. In some example embodiments, a plurality of variable resistance memory devices 7 may be arranged in the first direction DR1 and the second direction DR2 to form the variable resistance memory device (1 in FIG. 1) shown in FIG. 1. Except for shapes of the first electrode pattern 312, the second electrode pattern 322, and the fixed resistance layer 220, the variable resistance memory device 7 may be substantially the same as the variable resistance memory device 5 described with reference to FIGS. 8, 9A, and 9B.

The first electrode pattern 312, the second electrode pattern 322, and the fixed resistance layer 220 may have a cylindrical shape. In a plan view, the first electrode pattern 312, the second electrode pattern 322, and the fixed resistance layer 220 may overlap with each other. For example, the first electrode pattern 312, the second electrode pattern 322, and the fixed resistance layer 220 may completely overlap with each other in the third direction DR3. Side surfaces of the first electrode pattern 312, side surfaces of the second electrode pattern 322, and side surfaces of the fixed resistance layer 220 may be coplanar or substantially coplanar (e.g., coplanar within manufacturing tolerances and/or material tolerances) with each other.

When the first electrode pattern 312 or the second electrode pattern 322 includes an angled part, an electric field may concentrate on the angled part. The side surfaces of the first electrode pattern 312 and the side surfaces of the second electrode pattern 322 may be curved surfaces. Accordingly, the electric field may not concentrate on the side surfaces of the first electrode pattern 312 and the second electrode pattern 322.

In some example embodiments, the variable resistance layer 410 and the fixed resistance layer 220 may be replaced with each other. In other words, in some example embodiments, a configuration shown in FIG. 12 as the fixed resistance layer 220 may include a material having a variable resistance characteristic, and a configuration shown as the variable resistance layer 410 may include a material having a fixed resistance characteristic.

Some example embodiments may include the fixed resistance layer 220 and the variable resistance layer 410 electrically connected in parallel between the first electrode pattern 312 and the second electrode pattern 322. A degree of unevenness in the resistance change (a resistance change of the memory device MC in FIG. 1) between the first electrode pattern 312 and the second electrode pattern 322 may be reduced by the fixed resistance layer 220. Accordingly, the variable resistance memory device 7, which is highly reliable, may be provided.

Figure 13:
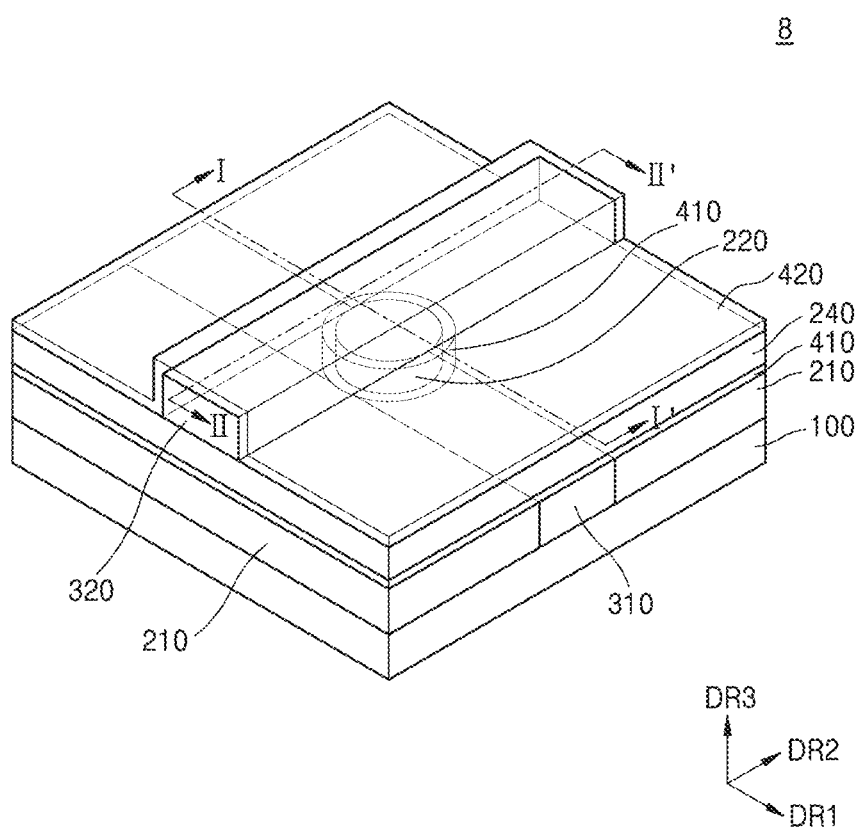
FIG. 13 is a perspective view of a variable resistance memory device according to some example embodiments.

FIG. 13 is a perspective view of a variable resistance memory device 8 according to some example embodiments. For brevity of description, substantially the same descriptions as those given with reference to FIGS. 1, 2, 3, 4A, 4B, 10, 11A, and 11B may be omitted. A cross-sectional view taken along line I-I' of FIG. 13 is the same as that of FIG. 11A. A cross-sectional view taken along line II-II' of FIG. 13 is the same as that of FIG. 11B.

Referring to FIG. 13, the variable resistance memory device 8 including the substrate 100, the first insulating layer 210, the fixed resistance layer 220, the first conductive line 310, the second conductive line 320, the variable resistance layer 410, and the additional variable resistance layer 420 may be provided. The variable resistance memory device 8 may correspond to each of the memory devices MC shown in FIG. 1 and components adjacent thereto. In some example embodiments, a plurality of variable resistance memory devices 8 may be arranged in the first direction DR1 and the second direction DR2 to form the variable resistance memory device (1 in FIG. 1) shown in FIG. 1.

Except for a shape of the fixed resistance layer 220, the variable resistance memory device 8 may be substantially the same as the variable resistance memory device 6 described with reference to FIGS. 10, 11A, and 11B. Side surfaces of the fixed resistance layer 220 may be curved surfaces. For example, the fixed resistance layer 220 may have a cylindrical shape.

In some example embodiments, the variable resistance layer 410 and the fixed resistance layer 220 may be replaced with each other. In other words, in some example embodiments, a configuration shown in FIG. 13 as the fixed resistance layer 220 may include a material having a variable resistance characteristic, and a configuration shown as the variable resistance layer 410 may include a material having a fixed resistance characteristic.

Some example embodiments may include the fixed resistance layer 220 and the variable resistance layer 410 electrically connected in parallel between the first conductive line 310 and the second conductive line 320. A degree of unevenness in the resistance change (a resistance change of the memory device MC in FIG. 1) between the first conductive line 310 and the second conductive line 320 may be reduced by the fixed resistance layer 220. Accordingly, the variable resistance memory device 8, which is highly reliable, may be provided.

Figure 14:
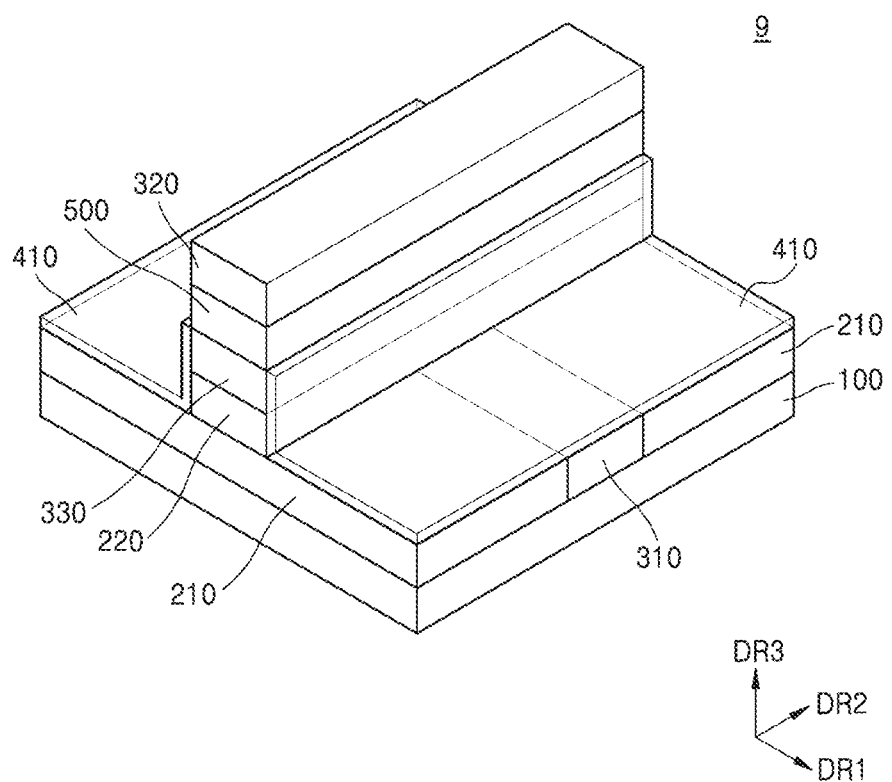
FIG. 14 is a perspective view of a variable resistance memory device according to some example embodiments.

FIG. 14 is a perspective view of a variable resistance memory device 9 according to some example embodiments. For brevity of description, substantially the same descriptions as those given with reference to FIGS. 1, 2, 3, 4A, and 4B may be omitted.

Referring to FIG. 14, the variable resistance memory device 9 including the substrate 100, the first insulating layer 210, the fixed resistance layer 220, the first conductive line 310, the second conductive line 320, an intermediate electrode layer 330, a selection device layer 500, and the variable resistance layer 410 may be provided. The variable resistance memory device 9 may correspond to each of the memory devices MC shown in FIG. 1 and components adjacent thereto. In some example embodiments, a plurality of variable resistance memory devices 9 may be arranged in the first direction DR1 and the second direction DR2 to form the variable resistance memory device (1 in FIG. 1) shown in FIG. 1. The substrate 100, the first insulating layer 210, the fixed resistance layer 220, the first conductive line 310, and the second conductive line 320 may be substantially the same as the substrate 100, the first insulating layer 210, the fixed resistance layer 220, the first conductive line 310, and the second conductive line 320 described with reference to FIGS. 3, 4A, and 4B.

The intermediate electrode layer 330 may be provided between the fixed resistance layer 220 and the second conductive line 320. The intermediate electrode layer 330 may overlap the fixed resistance layer 220 and the second conductive line 320 in the third direction DR3. The intermediate electrode layer 330 may extend in the second direction DR2. In a plan view, the intermediate electrode layer 330 may intersect with the first insulating layer 210 and the first conductive line 310. The intermediate electrode layer 330 may include a conductive material. For example, the intermediate electrode layer 330 may include at least one of metal (e.g., titanium (Ti), titanium nitride (TiN), tungsten (W), platinum (Pt), tantalum nitride (Al), and/or aluminum (Al)) and a doped semiconductor material (e.g., doped Si, doped IGZO, and/or doped GaAs).

The variable resistance layer 410 may be provided on the first insulating layer 210 and the first conductive line 310. The variable resistance layer 410 may extend along side surfaces of the fixed resistance layer 220 and the intermediate electrode layer 330. The variable resistance layer 410 may be electrically connected to the intermediate electrode layer 330. For example, the variable resistance layer 410 may be in direct contact with the intermediate electrode layer 330. The variable resistance layer 410 may expose an upper surface of the intermediate electrode layer 330. An uppermost surface of the variable resistance layer 410 may be coplanar or substantially coplanar (e.g., coplanar within manufacturing tolerances and/or material tolerances) with the upper surface of the intermediate electrode layer 330.

The selection device layer 500 may be provided between the intermediate electrode layer 330 and the second conductive line 320. The selection device layer 500 may be electrically connected to the intermediate electrode layer 330 and the second conductive line 320. The intermediate electrode layer 330 and the second conductive line 320 may be electrodes that are electrically connected to both terminals of a selection device included in the selection device layer 500. When the variable resistance layer 410 has a characteristic of a uni-polar resistance switching type, the selection device layer 500 may include a PN junction diode or a Schottky diode. When the variable resistance layer 410 has a characteristic of a bi-polar resistance switching type, the selection device layer 500 may include a non-linear selection device or a threshold switching device. When the selection device layer 500 includes the PN junction diode or the Schottky diode, current may flow through the selection device layer 500 when a forward bias voltage is applied to the selection device layer 500, and no current may flow through the selection device layer 500 when a backward bias voltage is applied to the selection device layer 500. That is, the selection device layer 500 may selectively block or pass the current according to the voltage applied to the selection device layer 500.

In some example embodiments, the variable resistance layer 410 and the fixed resistance layer 220 may be replaced with each other. In other words, in some example embodiments, a configuration shown in FIG. 14 as the fixed resistance layer 220 may include a material having a variable resistance characteristic, and a configuration shown as the variable resistance layer 410 may include a material having a fixed resistance characteristic.

Some example embodiments may include the selection device layer 500 between the second conductive line 320 and the intermediate electrode layer 330. The selection device layer 500 may reduce a leakage current.

Some example embodiments may include the fixed resistance layer 220 and the variable resistance layer 410 electrically connected in parallel between the first conductive line 310 and the second conductive line 320. A degree of unevenness in the resistance change (a resistance change of the memory device MC in FIG. 1) between the first conductive line 310 and the second conductive line 320 may be reduced by the fixed resistance layer 220. Accordingly, the variable resistance memory device 9, which is highly reliable, may be provided.

Figure 15:
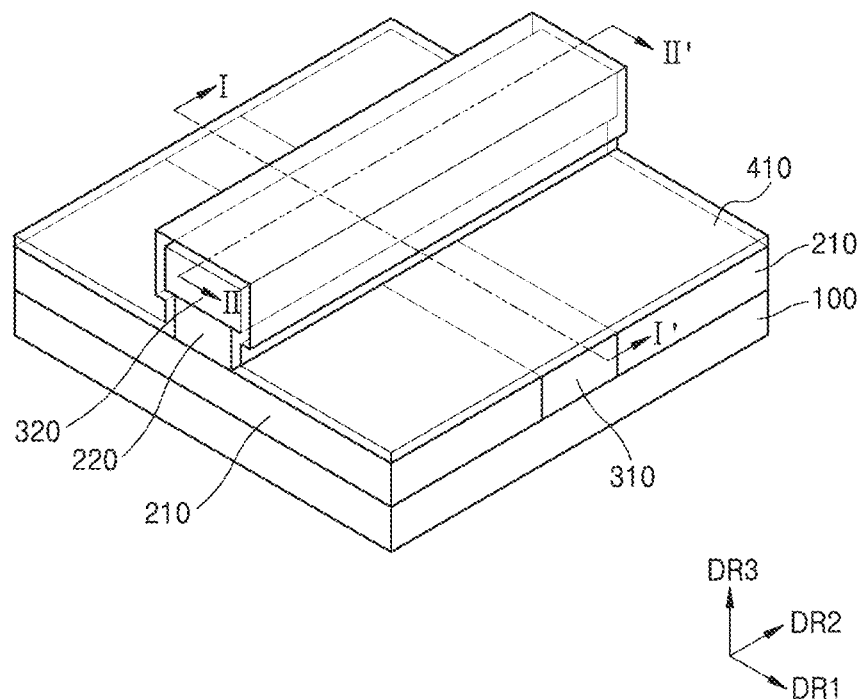
FIG. 15 is a perspective view of a variable resistance memory device according to some example embodiments.
Figure 16:
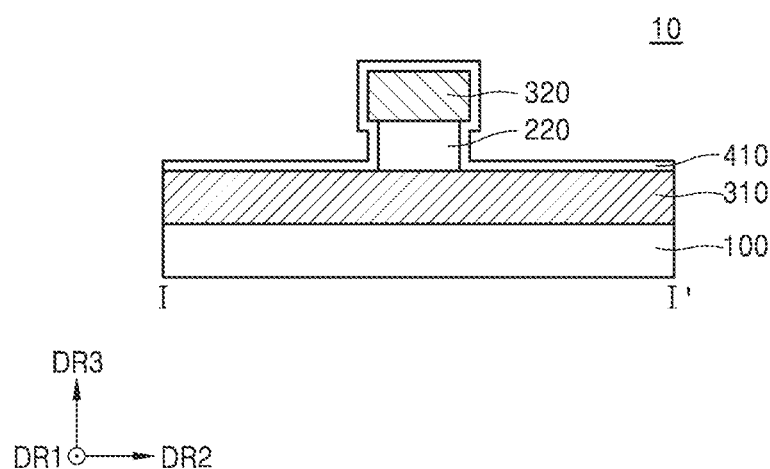
FIG. 16 is a cross-sectional view taken along line I-I' in FIG. 15.

FIG. 15 is a perspective view of a variable resistance memory device 10 according to some example embodiments. FIG. 16 is a cross-sectional view taken along line I-I' in FIG. 15. For brevity of description, substantially the same descriptions as those given with reference to FIGS. 1, 2, 3, 4A, and 4B may be omitted.

Referring to FIGS. 15 and 16, the variable resistance memory device 10 including the substrate 100, the first insulating layer 210, the fixed resistance layer 220, the first conductive line 310, the second conductive line 320, and the variable resistance layer 410 may be provided. The variable resistance memory device 10 may correspond to each of the memory devices MC shown in FIG. 1 and components adjacent thereto. In some example embodiments, a plurality of variable resistance memory devices 10 may be arranged in the first direction DR1 and the second direction DR2 to form the variable resistance memory device (1 in FIG. 1) shown in FIG. 1. The substrate 100, the first insulating layer 210, the first conductive line 310, the second conductive line 320, and the resistance layer 410 may be substantially the same as those described with reference to FIGS. 3, 4A, and 4B.

Unlike that described with reference to FIGS. 3, 4A, and 4B, a width of the fixed resistance layer 220 in the first direction DR1 may be smaller than a width of the second conductive line 320 in the first direction DR1. The fixed resistance layer 220 may expose a bottom surface of the second conductive line 320. Both ends of the second conductive line 320 in the first direction DR1 may respectively protrude from both side surfaces of the fixed resistance layer 220 directly adjacent thereto. A width of the fixed resistance layer 220 in the first direction DR1 may be adjusted by a process of selectively etching the fixed resistance layer 220. The width of the fixed resistance layer 220 in the first direction DR1 may be adjusted to control resistance of the fixed resistance layer 220. For example, the smaller the width of the fixed resistance layer 220, the greater the resistance of the fixed resistance layer 220. Accordingly, the fixed resistance layer 220 may have a desired resistance.

In some example embodiments, the variable resistance layer 410 and the fixed resistance layer 220 may be replaced with each other. In other words, in some example embodiments, for example the configuration shown in FIGS. 15 and 16 as the fixed resistance layer 220 may include a material having a variable resistance characteristic, and a configuration shown as the variable resistance layer 410 may include a material having a fixed resistance characteristic.

Some example embodiments may include the fixed resistance layer 220 and the variable resistance layer 410 electrically connected in parallel between the first conductive line 310 and the second conductive line 320. A degree of unevenness in the resistance change (a resistance change of the memory device MC in FIG. 1) between the first conductive line 310 and the second conductive line 320 may be reduced by the fixed resistance layer 220. Accordingly, the variable resistance memory device 10, which is highly reliable, may be provided.

Figure 17:
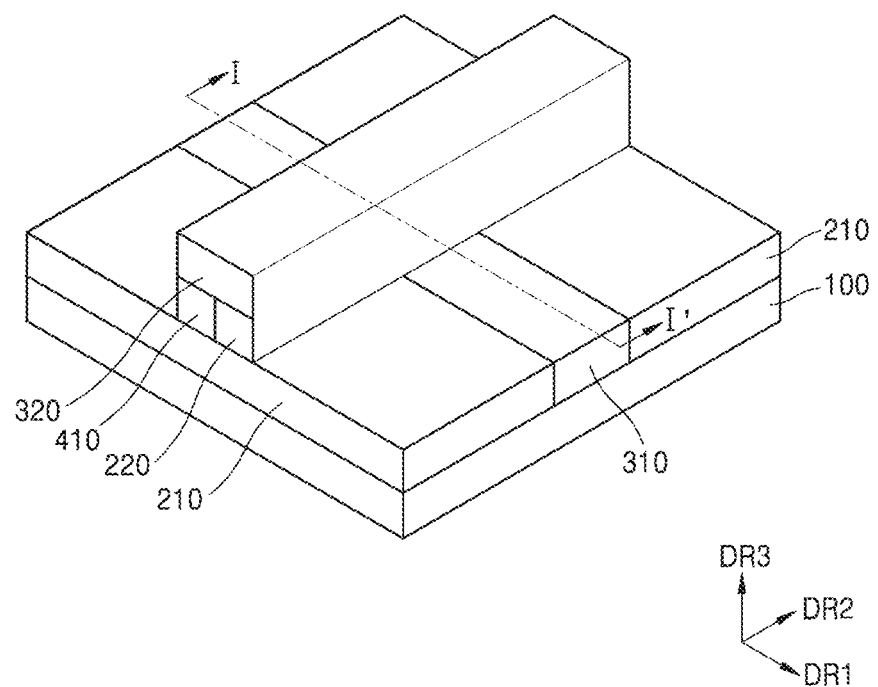
FIG. 17 is a perspective view of a variable resistance memory device according to some example embodiments.
Figure 18:
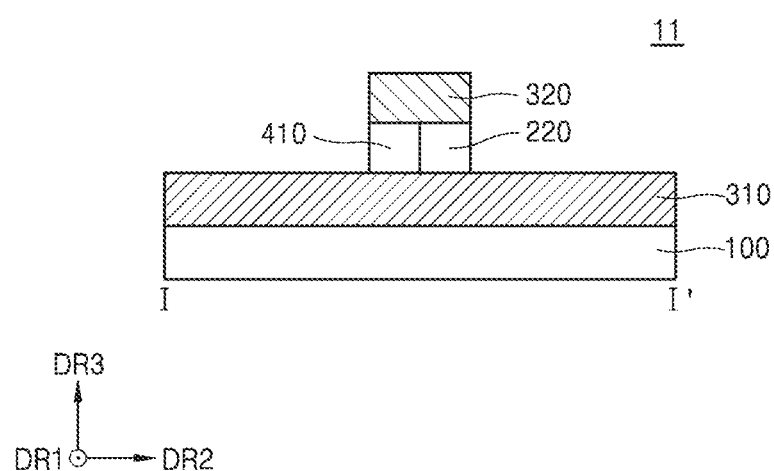
FIG. 18 is a cross-sectional view taken along line I-I' of FIG. 3.

FIG. 17 is a perspective view of a variable resistance memory device 10 according to some example embodiments. FIG. 18 is a cross-sectional view taken along line I-I' in FIG. 17. For brevity of description, substantially the same descriptions as those given with reference to FIGS. 1, 2, 3, 4A, and 4B may be omitted.

Referring to FIGS. 17 and 18, the variable resistance memory device 11 including the substrate 100, the first insulating layer 210, the fixed resistance layer 220, the first conductive line 310, the second conductive line 320, and the variable resistance layer 410 may be provided. The variable resistance memory device 11 may correspond to each of the memory devices MC shown in FIG. 1 and components adjacent thereto. In some example embodiments, a plurality of variable resistance memory devices 11 may be arranged in the first direction DR1 and the second direction DR2 to form the variable resistance memory device (1 in FIG. 1) shown in FIG. 1. The substrate 100, the first insulating layer 210, the first conductive line 310, the second conductive line 320, and the resistance layer 410 may be substantially the same as those described with reference to FIGS. 3, 4A, and 4B.

Unlike that described with reference to FIGS. 3, 4A, and 4B, the fixed resistance layer 220 and the variable resistance layer 410 may be below the second conductive line 320 and extend parallel to each other in the second direction DR2. The fixed resistance layer 220 may be under one side of the second conductive layer 320 and the variable resistance layer 410 may be under the other side of the second conductive layer. A width in the first direction DR1 of the resistance layer 220 and the variable resistance layer 410 may be the same as or different than a width in the first direction DR1 of the second conductive layer 320. A width of the fixed resistance layer 220 in the first direction DR1 may be adjusted by a process of selectively etching the fixed resistance layer 220. The width of the fixed resistance layer 220 in the first direction DR1 may be adjusted to control resistance of the fixed resistance layer 220. For example, the smaller the width of the fixed resistance layer 220, the greater the resistance of the fixed resistance layer 220. Accordingly, the fixed resistance layer 220 may have a desired resistance.

Some example embodiments may include the fixed resistance layer 220 and the variable resistance layer 410 electrically connected in parallel between the first conductive line 310 and the second conductive line 320. A degree of unevenness in the resistance change (a resistance change of the memory device MC in FIG. 1) between the first conductive line 310 and the second conductive line 320 may be reduced by the fixed resistance layer 220. Accordingly, the variable resistance memory device 10, which is highly reliable, may be provided.

Figure 19:
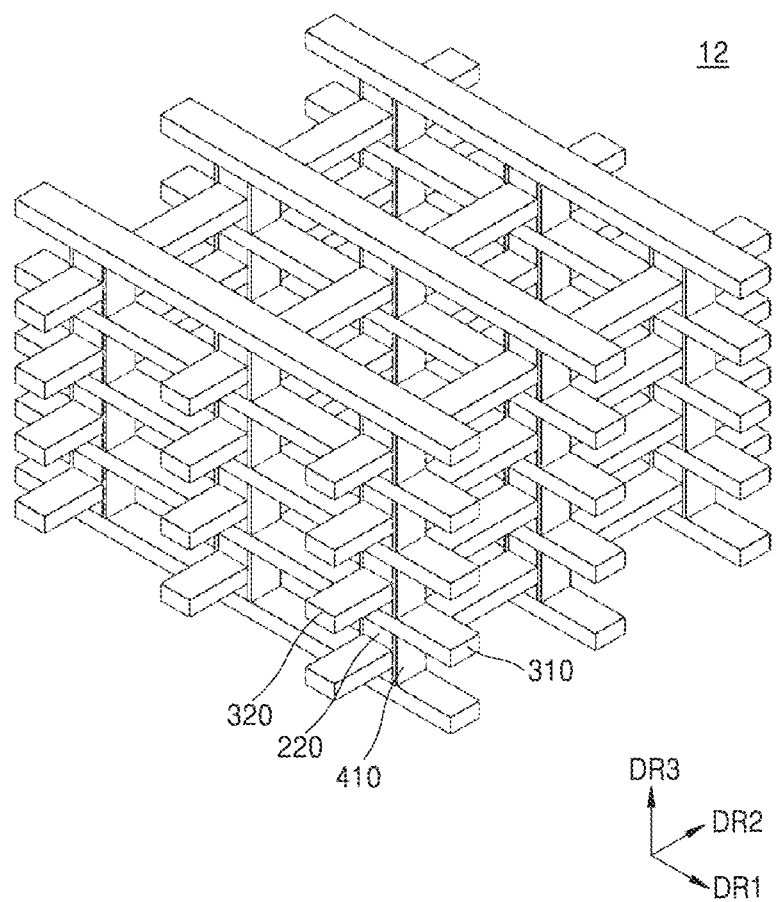
FIG. 19 is a perspective view of a variable resistance memory device according to some example embodiments.

FIG. 19 is a perspective view of a variable resistance memory device 12 according to some example embodiments. For brevity of description, substantially the same descriptions as those given with reference to FIGS. 1 and 2 may be omitted.

Referring to FIG. 19, the variable resistance memory device 12 including the first conductive line 310, the second conductive line 320, the fixed resistance layer 220, and the variable resistance layers 410 may be provided. The variable resistance memory device 12 may be provided with a plurality of variable resistance memory devices (2 in FIG. 2) described with reference to FIG. 2, wherein the plurality of variable resistance memory devices (2 in FIG. 2) are stacked.

First conductive line layers including the first conductive lines 310 and second conductive line layers including the second conductive lines 320 may be alternately stacked in the third direction DR3. The first conductive lines 310 respectively included in the first conductive line layers may extend in the first direction DR1 and may be arranged in the second direction DR2. The second conductive lines 320 respectively included in the second conductive line layers may extend in the second direction DR2 and may be arranged in the first direction DR1. Electrical characteristics of the first and second conductive lines 310 and 320 and materials that the first and second conductive lines 310 and 320 include may be substantially the same as those described with reference to FIG. 2.

The fixed resistance layer 220 may be provided between the first conductive line 310 and the second conductive line 320 that are immediately adjacent to each other. A pair of fixed resistance layers 220 may be disposed between an upper surface of one of a pair of first conductive lines 310 immediately adjacent to each other in the third direction DR3 and a bottom surface of the second conductive line 320 provided between the pair of first conductive lines 310 and between a bottom surface of the other one of the pair of first conductive lines 310 and an upper surface of the second conductive line 320. Each of the fixed resistance layers 220 may be electrically connected to the first conductive line 310 and the second conductive line 320 immediately adjacent thereto. For example, each of the fixed resistance layers 220 may be in direct contact with the first conductive line 310 and the second conductive line 320 immediately adjacent thereto. Electrical characteristics of the fixed resistance layers 220 and materials that the fixed resistance layers 220 include may be substantially the same as those described with reference to FIG. 2.

Each of the variable resistance layers 410 may be provided between the first conductive lines 310 immediately adjacent to each other. Each of the variable resistance layers 410 may extend along side surfaces of the pair of fixed resistance layers 220 immediately adjacent to each other and side surfaces of the second conductive line 320 provided therebetween. For example, the variable resistance layer 410 may conformally cover the side surfaces of the pair of fixed resistance layers 220 immediately adjacent to each other and the side surfaces of the second conductive line 320 provided therebetween. Each of the variable resistance layers 410 may be electrically connected to a pair of first conductive lines 310 immediately adjacent thereto and the second conductive line 320 provided therebetween. For example, each of the variable resistance layers 410 may be in direct contact with the pair of first conductive lines 310 and the second conductive lines 320. An upper portion of each of the variable resistance layers 410 may be electrically connected in parallel with one of the pair of fixed resistance layers 220 and a lower portion of each of the variable resistance layers 410 may be electrically connected to the other one of the pair of fixed resistance layers 220. Electrical characteristics of the variable resistance layers 410 and materials that the variable resistance layers 410 include may be substantially the same as those described with reference to FIG. 2.

In some example embodiments, the variable resistance layers 410 and the fixed resistance layers 220 may be replaced with each other. In other words, in some example embodiments, a configuration shown in FIG. 19 as the fixed resistance layers 220 may include a material having a variable resistance characteristic, and a configuration shown as the variable resistance layers 410 may include a material having a fixed resistance characteristic.

Some example embodiments may include the fixed resistance layer 220 and the variable resistance layer 410 that are electrically connected in parallel between the first conductive line 310 and the second conductive line 320. A degree of unevenness in a resistance change (a resistance change of the memory device MC in FIG. 1) between the first conductive line 310 and the second conductive line 320 may be reduced by the fixed resistance layer 220. Accordingly, the variable resistance memory device 6, which is highly reliable, may be provided.

Some example embodiments may a variable resistance memory device with improved uniformity of a resistance change characteristic. Some example embodiments may a variable resistance memory device with an improved reliability.

It should be understood that example embodiments described herein should be considered in a descriptive sense only and not for purposes of limitation. Descriptions of features or aspects within each example embodiment should typically be considered as available for other similar features or aspects in some other example embodiments. While one or more example embodiments have been described with reference to the figures, it will be understood by those of ordinary skill in the art that various changes in form and details may be made therein without departing from the spirit and scope as defined by the following claims.

What is claimed is:
1. A variable resistance memory device comprising:
    a first conductive line extending in a first direction;
    a second conductive line extending in a second direction, the second direction intersecting the first direction on the first conductive line;
    a fixed resistance layer between the first conductive line and the second conductive line; and
    a variable resistance layer between the first conductive line and the second conductive line,
    wherein the fixed resistance layer and the variable resistance layer are electrically connected in parallel to each other between the first conductive line and the second conductive line, and
    wherein
        the fixed resistance layer is in a region where the first conductive line and the second conductive line intersect each other,
        the variable resistance layer is on a side surface of the fixed resistance layer, and
        the fixed resistance layer extends in the second direction along the second conductive line.
2. The variable resistance memory device of claim 1, wherein the variable resistance layer extends on one side surface of the second conductive line immediately adjacent to the side surface of the fixed resistance layer and is electrically connected to the second conductive line.
3. The variable resistance memory device of claim 2, wherein the variable resistance layer extends along an upper surface and another side surface of the second conductive line.
4. The variable resistance memory device of claim 1, wherein a width of the fixed resistance layer in the first direction is less than a width of the second conductive line in the first direction.
5. The variable resistance memory device of claim 1, wherein
    the variable resistance layer is provided in a region where the first conductive line and the second conductive line intersect each other, and
    the fixed resistance layer is provided on one side surface of the variable resistance layer.
6. The variable resistance memory device of claim 1, further comprising:
    a first electrode pattern between the first conductive line and the fixed resistance layer; and
    a second electrode pattern between the second conductive line and the fixed resistance layer.
7. The variable resistance memory device of claim 6, wherein the variable resistance layer extends in a third direction perpendicular to the first and second directions and covers side surfaces of the first electrode pattern and the second electrode pattern.
8. The variable resistance memory device of claim 7, wherein the variable resistance layer exposes an upper surface of the second electrode pattern.
9. The variable resistance memory device of claim 6, wherein each of the first electrode pattern and the second electrode pattern has a rectangular column shape extending in a third direction perpendicular to the first and second directions.
10. The variable resistance memory device of claim 6, wherein each of the first electrode pattern and the second electrode pattern has a cylindrical shape extending in a third direction perpendicular to the first and second directions.
11. The variable resistance memory device of claim 1, further comprising:
    an intermediate electrode layer between the second conductive line and the fixed resistance layer; and a selection device layer between the second conductive line and the intermediate electrode layer,
wherein the selection device layer is configured to selectively block a current based on a voltage applied to the selection device layer.

12. The variable resistance memory device of claim 11, wherein the variable resistance layer exposes side surfaces of the selection device layer.

13. A variable resistance memory device comprising:
first conductive lines extending in a first direction and arranged in a second direction that intersects with the first direction;
second conductive lines extending in the second direction on the first conductive lines and arranged in the first direction;
fixed resistance layers provided between the first conductive lines and the second conductive lines; and
variable resistance layers electrically connected in parallel to the fixed resistance layers,
wherein each of the fixed resistance layers is electrically connected to one of the first conductive lines immediately adjacent thereto and one of the second conductive lines immediately adjacent thereto,
wherein each of the variable resistance layers is electrically connected to one of the first conductive lines immediately adjacent thereto and one of the second conductive lines immediately adjacent thereto, and
wherein
each of the fixed resistance layers is in a region where a respective one of the first conductive lines and a respective one of the second conductive lines intersect each other,
each of the variable resistance layers is on a side surface of a respective one of the fixed resistance layers, and
each of the fixed resistance layers extends in the second direction along a respective one of the second conductive lines.

14. The variable resistance memory device of claim 13, wherein
the variable resistance layers are respectively at regions where the first conductive lines and the second conductive lines intersect each other, and
each of the fixed resistance layers is on a side surface of the variable resistance layer immediately adjacent thereto among the variable resistance layers, and extends on a side surface of the respective one of the second conductive lines.

15. A variable resistance memory device comprising:
first conductive line layers and second conductive line layers that are alternately stacked;
fixed resistance layers between the first conductive line layers and the second conductive line layers; and
variable resistance layers between the first conductive line layers,
wherein each of the variable resistance layers extends along side surfaces of a pair of fixed resistance layers spaced apart from each other with one of the second conductive line layers therebetween among the fixed resistance layers,
wherein each of the first conductive line layers includes first conductive lines extending in a first direction and arranged in a second direction that intersects with the first direction, and
wherein each of the second conductive line layers includes second conductive lines extending in the second direction and arranged in the first direction.

16. The variable resistance memory device of claim 15, wherein each of the variable resistance layers is electrically connected to a pair of first conductive lines spaced apart from each other with each of the variable resistance layers therebetween among the first conductive lines and the second conductive line between the pair of first conductive lines among the second conductive lines.

17. The variable resistance memory device of claim 16, wherein each of the variable resistance layers includes a first part electrically connected in parallel with one of the pair of fixed resistance layers and a second part electrically connected in parallel with the other one of the pair of fixed resistance layers.

18. A variable resistance memory device comprising:
a first conductive line extending in a first direction;
a second conductive line extending in a second direction, the second direction intersecting the first direction on the first conductive line;
a parallel resistance layer electrically connecting the first and second conductive lines, the parallel resistance layer including a fixed resistance layer and a variable resistance layer electrically connected in parallel, the variable resistance layer being one of a phase change material or a layer configured to have mobile oxygen vacancies, and
wherein
the fixed resistance layer is in a region where the first conductive line and the second conductive line intersect each other,
the variable resistance layer is on a side surface of the fixed resistance layer, and
the fixed resistance layer extends in the second direction along the second conductive line.

19. The variable resistance memory device of claim 18, wherein the layer configured to have mobile oxygen vacancies includes
a dielectric layer, and
one of an oxide layer or a nitride layer.

20. The variable resistance memory device of claim 18, further comprising:
a first electrode pattern between the first conductive line and the fixed resistance layer; and
a second electrode pattern between the second conductive line and the fixed resistance layer.

21. The variable resistance memory device of claim 18, further comprising:
a first insulating layer coplanar with the first conductive line, the first insulating layer defining a trench, and the first conductive line being in the trench.

22. The variable resistance memory device of claim 21, further comprising:
a first electrode pattern between the first conductive line and the fixed resistance layer;
a second electrode pattern between the second conductive line and the fixed resistance layer; and
a second insulating layer on the first insulating layer, the second insulating layer contacting opposite side surfaces of the first electrode pattern in the second direction.

23. A variable resistance memory device comprising:
a first conductive line extending in a first direction;
a second conductive line extending in a second direction, the second direction intersecting the first direction on the first conductive line;
a variable resistance layer provided in a region where the first conductive line and the second conductive line intersect each other; and a fixed resistance layer provided on a side of the variable resistance layer, wherein the fixed resistance layer and the variable resistance layer are electrically connected in parallel to each other between the first conductive line and the second conductive line, and wherein the variable resistance layer extends in the second direction along the second conductive line.

\* \* \* \* \*